(12) United States Patent
Xu et al.

(10) Patent No.: US 11,438,097 B2
(45) Date of Patent: Sep. 6, 2022

(54) MEDIA CONTENT-BASED ADAPTIVE METHOD, DEVICE AND SYSTEM FOR FORWARD ERROR CORRECTION (FEC) CODING AND DECODING OF SYSTEMATIC CODE, AND MEDIUM

(71) Applicant: SHANGHAI JIAO TONG UNIVERSITY, Shanghai (CN)

(72) Inventors: Yiling Xu, Shanghai (CN); Wenjun Zhang, Shanghai (CN); Ning Liu, Shanghai (CN); Yunfeng Guan, Shanghai (CN); Yanfeng Wang, Shanghai (CN); Jun Sun, Shanghai (CN); Zhiqian Jiang, Shanghai (CN); Hao Chen, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 219 days.

(21) Appl. No.: 16/740,229

(22) Filed: Jan. 10, 2020

(65) Prior Publication Data
US 2020/0153545 A1 May 14, 2020

Related U.S. Application Data

(63) Continuation of application No. PCT/CN2018/095051, filed on Jul. 9, 2018.

(30) Foreign Application Priority Data

Jul. 11, 2017 (CN) .......................... 201710561850.2
Oct. 18, 2017 (CN) .......................... 201710973473.3

(51) Int. Cl.
*H04L 1/00* (2006.01)
*H04L 69/22* (2022.01)
(Continued)

(52) U.S. Cl.
CPC ......... *H04L 1/0057* (2013.01); *H03M 13/118* (2013.01); *H03M 13/2906* (2013.01);
(Continued)

(58) Field of Classification Search
CPC ....... H04L 1/0057; H04L 69/22; H04L 1/007; H04L 1/00; H04L 1/0043; H04L 1/0076;
(Continued)

(56) References Cited

U.S. PATENT DOCUMENTS 6,317,462 B1 * 11/2001 Boyce ................ H04N 21/2381
375/240.27
2007/0195894 A1 8/2007 Shokrollahi et al.
(Continued)

FOREIGN PATENT DOCUMENTS

CN 103248897 A 8/2013
CN 106603192 A 4/2017
(Continued)

OTHER PUBLICATIONS

International Search Report of PCT/CN2018/095051.
Written Opinion of PCT/CN2018/095051.

*Primary Examiner* — Vinncelas Louis
(74) *Attorney, Agent, or Firm* — Dragon Sun Law Firm, PC; Jinggao Li, Esq.; Nathaniel Perkins

(57) ABSTRACT

A media content-based adaptive method, device and system for Forward Error Correction (FEC) coding and decoding of a systematic code, and a medium are provided. The method includes: dividing, according to the importance of media content, source data into N types of source data packets according to priorities; generating N types of intermediate codes according to the N types of source data packets and the priorities thereof; setting, according to the N types of intermediate codes, recovery data of N types of source data according to a channel condition, and generating coded
(Continued)

symbols of N types of systematic codes; receiving the coded symbols, and arranging and sorting the coded symbols according to decoding requirements; and decoding, according to the number of received coded symbols, intermediate codewords according to different situations, and recovering the corresponding source data packets according to the intermediate codewords.

31 Claims, 12 Drawing Sheets

(51) Int. Cl.
  *H03M 13/11* (2006.01)
  *H03M 13/29* (2006.01)
(52) U.S. Cl.
  CPC ............... *H04L 1/00* (2013.01); *H04L 1/007* (2013.01); *H04L 69/22* (2013.01)

(58) Field of Classification Search
  CPC ............ H04L 65/607; H03M 13/2906; H03M 13/118; H03M 13/611; H03M 13/616; H03M 13/1102; H03M 13/356
  See application file for complete search history.

(56) References Cited

U.S. PATENT DOCUMENTS

| | | | |
|---|---|---|---|
| 2010/0223533 A1* | 9/2010 | Stockhammer | H04L 1/009 714/776 |
| 2013/0254631 A1* | 9/2013 | Lu | H04L 1/1819 714/776 |
| 2018/0091819 A1* | 3/2018 | Cook | H04N 19/67 |

FOREIGN PATENT DOCUMENTS

| | | |
|---|---|---|
| EP | 1198100 A2 | 4/2002 |
| EP | 2091205 A1 | 8/2009 |

* cited by examiner

MEDIA CONTENT-BASED ADAPTIVE METHOD, DEVICE AND SYSTEM FOR FORWARD ERROR CORRECTION (FEC) CODING AND DECODING OF SYSTEMATIC CODE, AND MEDIUM

CROSS-REFERENCE TO RELATED APPLICATIONS

This application is a bypass continuation application of PCT Application No. PCT/CN2018/095051. This application claims priority from PCT Application No. PCT/CN2018/095051, filed Jul. 9, 2018 and CN Application No. CN201710973473.3, filed Oct. 18, 2017 and CN201710561850.2, filed Jul. 11, 2017, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND

Technical Field

The present invention relates to the technical field of multimedia transmission, and more particularly, to a media content-based adaptive method, device and system for Forward Error Correction (FEC) coding and decoding of a systematic code, and a medium.

Related Art

In anisomeric network media service system, content is distributed to terminals through an Internet protocol or a broadcast protocol. In the Internet, IP/TCP or UDP messages are used to transmit media data, and the content is transmitted in broadcasts through MPEG2-TS. The UDP messages may be lost after passing through a plurality of network devices, and broadcast TS streams may have bit errors due to the impact of a transmission environment, which may cause screen damage or sound pause on a terminal side.

A Forward Error Correction (FEC) technology is a coding technology widely used in a communication system. A server side performs error correction coding on media data, adds redundant information and sends them together. The terminal side performs reverse FEC decoding to recover lost messages. A typical block code is taken as an example. The basic principle is: coding, at a sending end, k bit information as a block, adding (n-k) bit redundancy check information, and forming a codeword having a length of n bits. After the codeword reaches a receiving end via a channel, if an error is within an error correction range, an error bit may be checked and corrected by decoding, so as to resist interference caused by the channel, effectively reduce the bit error rate of the system, and improve the reliability of the communication system. However, FEC processing reduces the bit error rate of the system at the cost of redundancy overheads. Excessive FEC coding may also cause pressure on the real-time performance and network status of the system.

Unequal Error Protection (UEP) is a type of joint source channel coding. The core idea is that according to different importance levels of various data of a code stream, different channel protection mechanisms are adopted for various data, that is, important code streams are subjected to key protection. Although the UEP reduces the anti-noise performance of non-important code streams, it is beneficial to improvement of the overall bit error-resisting performance of the system.

As an FEC technology, during the transmission process of a digital fountain code, feedback and automatic retransmission mechanisms are not required, thereby avoiding the delay of a signal round trip and the problem of feedback explosions in broadcasting applications. The basic idea of a digital fountain is that the sending end divides original data into k data symbols, codes the data symbols, and outputs a coded symbol code stream of any length; and the receiving end only needs to correctly receive n (slightly greater thank) coded symbols to recover all the k data symbols with a large probability. The digital fountain code itself has UEP performance, which may achieve protection of data of different importance levels.

SUMMARY

In view of the defects in the conventional art, an object of the present invention is to provide a media content-based adaptive method, device and system for FEC coding and decoding of a systematic code, and a medium.

A media content-based adaptive method for FEC coding and decoding of a systematic code provided according to the present invention includes:

dividing, according to the importance of media content, source data into N types of source data packets according to priorities, N being an integer greater than 1;

generating N types of intermediate codes according to the priorities of the source data and the N types of source data packets;

setting, according to the N types of intermediate codes, recovery data of N types of source data according to a channel condition, and generating N types of coded symbols;

receiving the coded symbols, arranging and sorting the coded symbols according to decoding requirements, and decoding the coded symbols; and preferentially decoding, according to the situation of received coded symbols, an intermediate codeword having a high priority, and recovering a corresponding source data packet according to the intermediate codeword.

Preferably, generating the N types of intermediate codes according to the priorities of the source data and the N types of source data packets includes:

constructing coding matrices corresponding to the N types of source data packets, denoted as $A_i$, i=1, 2, ... N, $$A_i = \begin{bmatrix} G\_p_i \\ G\_ENC_i \end{bmatrix} i = 1, 2, \ldots N,$$

where $A_i$ represents a coding matrix corresponding to an $i^{th}$ source data packet, $G\_p_i$ represents a joint matrix composed of an LDPC matrix and an identity matrix corresponding to the $i^{th}$ source data packet, and $G\_ENC_i$ represents an LT coding matrix corresponding to the $i^{th}$ source data packet; and constructing a coding matrix A of the source data according to the coding matrices corresponding to the N types of source data packets, the coding matrix of the source data being as follows:

$$A = \begin{bmatrix} G\_p_1 & 0 & \ldots & 0 \\ G\_ENC_1 & 0 & \ldots & 0 \\ 0 & G\_p_i & \ldots & 0 \\ 0 & G\_ENC_i & \ldots & 0 \\ \ldots & \ldots & \ldots & \ldots \\ 0 & 0 & \ldots & G\_p_N \\ 0 & 0 & \ldots & G\_ENC_N \end{bmatrix}$$

$$A \begin{bmatrix} C_1 \\ C_2 \\ \ldots \\ C_i \\ \ldots \\ C_N \end{bmatrix} = \begin{bmatrix} 0 \\ D_1 \\ 0 \\ D_i \\ \ldots \\ 0 \\ D_N \end{bmatrix}$$

Then:

$$\begin{bmatrix} C_1 \\ C_2 \\ \ldots \\ C_N \end{bmatrix} = \begin{bmatrix} A_1^{-1} & 0 & \ldots & 0 \\ 0 & A_2^{-1} & \ldots & 0 \\ \ldots & \ldots & \ldots & \ldots \\ \ldots & \ldots & \ldots & A_N^{-1} \end{bmatrix} \begin{bmatrix} 0 \\ D_1 \\ 0 \\ D_2 \\ \ldots \\ 0 \\ D_N \end{bmatrix},$$

where $C_1, C_2, \ldots, C_i \ldots, C_N$ correspond to intermediate codes of N types of source data packets respectively, $D_1, D_2, \ldots, D_i \ldots, D_N$ correspond to data of the N types of source data packets respectively, and a superscript $-1$ is an inverse matrix operator.

Preferably, setting, according to the N types of intermediate codes, the recovery data of the N types of source data according to the channel condition includes:

$$\begin{bmatrix} D_1 \\ D_2 \\ \ldots \\ D_N \\ R_1 \\ R_2 \\ \ldots \\ R_N \end{bmatrix} = \begin{bmatrix} G\_ENC_1 & 0 & \ldots & 0 \\ 0 & G\_ENC_2 & \ldots & 0 \\ \ldots & \ldots & \ldots & \ldots \\ 0 & 0 & \ldots & G\_ENC_N \\ G\_ENC_{11} & 0 & \ldots & 0 \\ G\_ENC_{12} & G\_ENC_{21} & \ldots & 0 \\ \ldots & \ldots & \ldots & \ldots \\ G\_ENC_{1N} & G\_ENC_{2(N-1)} & \ldots & G\_ENC_{N1} \end{bmatrix} \begin{bmatrix} C_1 \\ C_2 \\ \ldots \\ C_N \end{bmatrix},$$

where $R_1, R_2, \ldots, R_i \ldots, R_N$ correspond to recovery data of N source data packets respectively, $G\_ENC_{1i}$ represents an LT coding matrix with the same generation rule as $G\_ENC_1$, $G\_ENC_{i1}$ represents an LT coding matrix with the same generation rule as $G\_ENC_i$, and $i=1, 2, \ldots N$.

Preferably, when N has a value of 2, the following intermediate codes may be generated for data of different importance levels as follows:

$$\begin{bmatrix} C_1 \\ C_2 \end{bmatrix} = \begin{bmatrix} A_1^{-1} & 0 \\ 0 & A_2^{-1} \end{bmatrix} \begin{bmatrix} 0 \\ D_1 \\ 0 \\ D_2 \end{bmatrix}.$$

The structure of the LT coding matrix is changed to obtain $G\_ENC_{11}$, $G\_ENC_{12}$ and $G\_ENC_{21}$. $G\_ENC_{12}$ and $G\_ENC_1$ have the same generation mode. $G\_ENC_{21}$ and $G\_ENC_2$ have the same generation mode. $G\_ENC_{11}$ represents an LT coding matrix with the same generation mode as $G\_ENC_1$. $G\_ENC_{21}$ represents an LT coding matrix with the same generation mode as $G\_ENC_2$. $G\_ENC_{12}$ represents an LT coding matrix with the same generation mode as $G\_ENC_1$.

The obtained recovery data $R_1$ is only related to data with a priority of 1, and the recovery data $R_2$ is related to both data with a priority of 1 and data with a priority of 2 to obtain:

$$\begin{bmatrix} D_1 \\ D_2 \\ R_1 \\ R_2 \end{bmatrix} = \begin{bmatrix} G\_ENC_1 & 0 \\ 0 & G\_ENC_2 \\ G\_ENC_{11} & 0 \\ G\_ENC_{12} & G\_ENC_{21} \end{bmatrix} \begin{bmatrix} C_1 \\ C_2 \end{bmatrix}.$$

Preferably, when N has a value of 2, receiving the coded symbols to decode the coded symbols includes:

obtaining an intermediate codeword according to a recovery matrix W and a received source data packet in the first stage of decoding, is specifically represented by:

$$W \begin{bmatrix} C_1 \\ C_2 \end{bmatrix} = \begin{bmatrix} 0 \\ REV\_D_1 \\ 0 \\ REV\_D_2 \\ REV\_R_1 \\ REV\_R_2 \end{bmatrix}$$

$$W = \begin{bmatrix} G\_p_1 & 0 \\ REV\_G\_ENC_1 & 0 \\ 0 & G\_p_2 \\ 0 & REV\_G\_ENC_2 \\ REV\_G\_ENC_{11} & 0 \\ REV\_G\_ENC_{12} & REV\_G\_ENC_{21} \end{bmatrix},$$

where $REV\_G\_ENC_1$ represents an LT coding matrix after removing a row corresponding to a lost packet in $G\_ENC_1$ according to a packet loss situation of the received coded symbols; $REV\_G\_ENC_{11}$ represents an LT coding matrix after removing a row corresponding to a lost packet in $G\_ENC_{11}$ according to a packet loss situation of the received coded symbols; $REV\_G\_ENC_{12}$ represents an LT coding matrix after removing a row corresponding to a lost packet in $G\_ENC_{12}$ according to a packet loss situation of the received coded symbols; $REV\_G\_ENC_2$ represents an LT coding matrix after removing a row corresponding to a lost packet in $G\_ENC_2$ according to a packet loss situation of the received coded symbols; and $REV\_G\_ENC_{21}$ represents an LT coding matrix after removing a row corresponding to a lost packet in $G\_ENC_{21}$ according to a packet loss situation of the received coded symbols.

$$REV\_A = \begin{bmatrix} G\_p_1 & 0 \\ REV\_G\_ENC_1 & 0 \\ REV\_G\_ENC_{11} & 0 \\ 0 & G\_p_2 \\ 0 & REV\_G\_ENC_2 \\ REV\_G\_ENC_{12} & REV\_G\_ENC_{21} \end{bmatrix},$$

and decoding is performed according to the number of received source data packets under the corresponding priority and the total number of received data packets.

When the total number of received coded symbols is less than the number of coded symbols generated by source data, and a row number of $$REV\_A_1 = \begin{bmatrix} G\_p_1 \\ REV\_G\_ENC_1 \\ REV\_G\_ENC_{11} \end{bmatrix}$$

is less than a column number, $C_1$ and $C_2$ cannot be solved.

When the total number of received coded symbols is less than the number of coded symbols generated by source data, and a row number of $$REV\_A_1 = \begin{bmatrix} G\_p_1 \\ REV\_G\_ENC_1 \\ REV\_G\_ENC_{11} \end{bmatrix}$$

is greater than or equal to a column number, $REV\_A_1$ is reversible, and a corresponding inverse matrix is denoted as $REV\_A_1^{-1}$. Therefore, $$[C_1] = REV\_A^{-1} = \begin{bmatrix} 0 \\ REV\_D_1 \\ REV\_R_1 \end{bmatrix}$$

is obtained, where $C_2$ has no solution.

In the formula, $REV\_D_1$ represents received source data with a priority of 1, and $REV\_R_1$ represents recovery data of the received source data with a priority of 1.

When the total number of received coded symbols is greater than or equal to the number of coded symbols generated by source data, and a row number of $$REV\_A_1 = \begin{bmatrix} G\_p_1 \\ REV\_G\_ENC_1 \\ REV\_G\_ENC_{11} \end{bmatrix}$$

is greater than or equal to a column number, if the row number of $$REV\_A_1 = \begin{bmatrix} G\_p_1 \\ REV\_G\_ENC_1 \\ REV\_G\_ENC_{11} \end{bmatrix}$$

is greater than or equal to the column number, $REV\_A_1$ is reversible, and a corresponding inverse matrix is denoted as $REV\_A_2^{-1}$; if a row number of $$REV\_A_2 = \begin{bmatrix} G\_p_2 \\ REV\_G\_ENC_2 \\ REV\_G\_ENC_{21} \end{bmatrix}$$

is greater than or equal to a column number, $REV\_A_2$ is reversible, and a corresponding inverse matrix is denoted as $REV\_A_2^{-1}$; and if $REV\_A_1$ and $REV\_A_2$ are reversible, $REV\_A$ is reversible, a corresponding inverse matrix is denoted as $REV\_A^{-1}$, $$B_{1\_1} = \begin{bmatrix} 0 \\ 0 \\ REV\_G\_ENC_{12} \end{bmatrix}, \text{ and}$$

$$REV\_A^{-1} = \begin{bmatrix} REV\_A_1^{-1} & 0 \\ REV\_A_2^{-1}B_{1\_1}REV\_A_1^{-1} & REV\_A_2^{-1} \end{bmatrix}.$$

Therefore, $$\begin{bmatrix} C_1 \\ C_2 \end{bmatrix} = REV\_A^{-1} \begin{bmatrix} 0 \\ REV\_D_1 \\ REV\_R_1 \\ 0 \\ REV\_D_2 \\ REV\_R_2 \end{bmatrix} =$$

$$\begin{bmatrix} REV\_A_1^{-1} & 0 \\ REV\_A_2^{-1}B_{1\_1}REV\_A_1^{-1} & REV\_A_2^{-1} \end{bmatrix} \begin{bmatrix} 0 \\ REV\_D_1 \\ REV\_R_1 \\ 0 \\ REV\_D_2 \\ REV\_R_2 \end{bmatrix}$$

is obtained.

If the row number of $$REV\_A_2 = \begin{bmatrix} G\_p_2 \\ REV\_G\_ENC_2 \\ REV\_G\_ENC_{21} \end{bmatrix}$$

is greater than or equal to the column number, $REV\_A_2$ does not have an inverse matrix, and $$[C_1] = REV\_A^{-1} = \begin{bmatrix} 0 \\ REV\_D_1 \\ REV\_R_1 \end{bmatrix}$$

can only be solved.

In the formula, $REV\_D_2$ represents received source data with a priority of 2, and $REV\_R_2$ represents recovery data of the received source data with a priority of 1 and a priority of 2.

When the total number of received coded symbols is greater than or equal to the number of coded symbols generated by source data, the row number of $$REV\_A_1 = \begin{bmatrix} G\_p_1 \\ REV\_G\_ENC_1 \\ REV\_G\_ENC_{11} \end{bmatrix}$$

is less than the column number, and the row number of $$REV\_A_2 = \begin{bmatrix} G\_p_2 \\ REV\_G\_ENC_2 \\ REV\_G\_ENC_{21} \end{bmatrix}$$

is greater than or equal to the column number,
a Gaussian elimination method is used to directly solve a matrix REV_A, which solves the following linear equations:

$$\begin{bmatrix} G\_p_1 & 0 \\ REV\_G\_ENC_1 & 0 \\ REV\_G\_ENC_{11} & 0 \\ 0 & G\_p_2 \\ 0 & REV\_G\_ENC_2 \\ REV\_G\_ENC_{12} & REV\_G\_ENC_{21} \end{bmatrix} \begin{bmatrix} C_1 \\ C_2 \end{bmatrix} = \begin{bmatrix} 0 \\ REV\_D_1 \\ REV\_R_1 \\ 0 \\ REV\_D_2 \\ REV\_R_2 \end{bmatrix},$$

and $C_1$ and $C_2$ are obtained.

Preferably, due to the loss of some data, a recovery matrix needs to be generated according to the received coded symbols, which is equivalent to erasing matrix rows corresponding to the lost coded symbols to form a corresponding recovery matrix, denoted as REV_G_ENC. According to different numbers of received data packets, intermediate codewords are generated in different situations. Specifically, the following steps are included:

step A1: assuming that data packets of l types of priorities are received to obtain the following recovery matrix equation:

$$\begin{bmatrix} G\_p_1 & 0 & \ldots & 0 \\ REV\_G\_ENC_1 & 0 & \ldots & 0 \\ 0 & G\_p_2 & \ldots & 0 \\ 0 & REV\_G\_ENC_2 & \ldots & 0 \\ \ldots & \ldots & \ldots & \ldots \\ 0 & 0 & \ldots & G\_p_l \\ 0 & 0 & \ldots & REV\_G\_ENC_l \\ REV\_G\_ENC_{11} & 0 & \ldots & 0 \\ REV\_G\_ENC_{12} & REV\_G\_ENC_{21} & \ldots & 0 \\ \ldots & \ldots & \ldots & \ldots \\ REV\_G\_ENC_{1l} & REV\_G\_ENC_{2(l-1)} & \ldots & REV\_G\_ENC_{l1} \end{bmatrix} \begin{bmatrix} C_1 \\ C_2 \\ \ldots \\ C_l \end{bmatrix} =$$

$$\begin{bmatrix} 0 \\ REV\_D_1 \\ 0 \\ REV\_D_2 \\ \ldots \\ 0 \\ REV\_D_l \\ REV\_R_1 \\ REV\_R_2 \\ \ldots \\ REV\_R_l \end{bmatrix},$$

and
performing elementary row transformation on the recovery matrix equation to obtain:

$$\begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_l \\ 0 & 0 & \ldots & REV\_G\_ENC_l \\ REV\_G\_ENC_{1l} & REV\_G\_ENC_{2(l-1)} & \ldots & REV\_G\_ENC_{l1} \end{bmatrix} \begin{bmatrix} C_1 \\ C_2 \\ \ldots \\ C_l \end{bmatrix} =$$

$$\begin{bmatrix} 0 \\ REV\_D_1 \\ REV\_R_1 \\ 0 \\ REV\_D_2 \\ REV\_R_2 \\ \ldots \\ 0 \\ REV\_D_l \\ REV\_R_l \end{bmatrix},$$

where REV_G_ENC$_1$ represents an LT coding matrix after removing a row corresponding to a lost packet in G_ENC$_1$ according to a packet loss situation of the received coded symbols; REV_G_ENC$_{11}$ represents an LT coding matrix after removing a row corresponding to a lost packet in G_ENC$_{11}$ according to a packet loss situation of the received coded symbols; REV_G_ENC$_{12}$ represents an LT coding matrix after removing a row corresponding to a lost packet in G_ENC$_{12}$ according to a packet loss situation of the received coded symbols; REV_G_ENC$_2$ represents an LT coding matrix after removing a row corresponding to a lost packet in G_ENC$_2$ according to a packet loss situation of the received coded symbols; REV_G_ENC$_{21}$ represents an LT coding matrix after removing a row corresponding to a lost packet in G_ENC$_{21}$ according to a packet loss situation of the received coded symbols; REV_D$_1$ represents received source data with a priority of 1, and REV_R$_1$ represents recovery data of the received source data with a priority of 1; REV_D$_2$ represents received source data with a priority of 2, and REV_$R_2$ represents recovery data of the received source data with a priority of 1 and a priority of 2; and REV_G_ENC$_{1l}$ represents an LT coding matrix after removing a row corresponding to a lost packet in G_ENC$_{1l}$ according to a packet loss situation of the received coded symbols, REV_$D_l$ represents received source data with a priority of 1, REV_$R_l$ represents recovery data of the received source data with a priority of 1 to 1, and $C_l$ represents a generated $l^{th}$ type of intermediate codes;

step A2: making and making $$REV\_A = \begin{bmatrix} G\_p_1 & 0 & \cdots & 0 \\ REV\_G\_ENC_1 & 0 & \cdots & 0 \\ REV\_G\_ENC_{11} & 0 & \cdots & 0 \\ 0 & G\_p_2 & \cdots & 0 \\ 0 & REV\_G\_ENC_2 & \cdots & \cdots \\ REV\_G\_ENC_{12} & REV\_G\_ENC_{21} & \cdots & 0 \\ \cdots & \cdots & \cdots & \cdots \\ 0 & 0 & \cdots & G\_p_l \\ 0 & 0 & \cdots & REV\_G\_ENC_l \\ REV\_G\_ENC_{1l} & REV\_G\_ENC_{2(l-1)} & \cdots & REV\_G\_ENC_{ll} \end{bmatrix},$$

R(i) be the number of $i^{th}$-stage of coded symbols received and expanded and L(i) be the length of each stage of symbols of a coding end, where 1≤i≤l;

calculating a rank of each stage of generation matrix:

eachRank(i)=min(Len(R(i)), sum(L(1:i))), where eachRank(i) represents a rank of a sub-matrix corresponding to data with a priority of i, where the sub-matrix corresponding to i=2 is $$\begin{bmatrix} 0 & G\_p_2 \\ 0 & REV\_G\_ENC_2 \\ REV\_G\_ENC_{12} & REV\_G\_ENC_{21} \end{bmatrix},$$

Len(R(i)) represents the length of the number of received coded symbols with a priority of i, sum(L(1:i)) represents a column number of a sub-matrix with a priority of i, and min( ) represents a minimalization operation;

calculating a rank of a cumulative matrix:

cumRank(i)=min(cumRank(i−1)+eachRank(i), sum(L(1:i))), where cumRank(i) represents the sum of ranks of sub-matrices corresponding to a priority of 1 to a priority of i, and cumRank(i−1) represents the sum of ranks of sub-matrices corresponding to a priority of 1 to a priority of i−1, where cumRank(1)=eachRank(1); and sequentially determining cumRank(i)>=sum(L(1:i)): if so, cumFullRank(i)=1; otherwise, cumFullRank(i)=0, where cumFullRank(i) represents a full rank of a matrix composed of sub-matrices corresponding to a priority of 1 to a priority of i;

step A3: solving intermediate codes $C_1, C_2 \ldots C_l$ in different situations according to the number of each stage of received coded symbols respectively, and setting an initial value of i to 1;

if satisfying cumFullRand(i)==1 && cumFullRank(1:i)>0, using an RFC 6330 decoding method to solve $C_1$–$C_i$, where && represents an AND operation, cumFullRank(1:i) represents a full rank of a matrix composed of sub-matrices corresponding to a priority of 1 to a priority of i, $C_1$ represents an intermediate codeword corresponding to data with a priority of 1, and $C_i$ represents an intermediate code corresponding to data with a priority of i;

if $$REV\_A_{\Delta i} = \begin{bmatrix} G\_p_1 & 0 & \cdots & 0 \\ REV\_G\_ENC_1 & 0 & \cdots & 0 \\ REV\_G\_ENC_{11} & 0 & \cdots & 0 \\ 0 & G\_p_2 & \cdots & 0 \\ 0 & REV\_G\_ENC_2 & \cdots & \cdots \\ REV\_G\_ENC_{12} & REV\_G\_ENC_{21} & \cdots & 0 \\ \cdots & \cdots & \cdots & \cdots \\ 0 & 0 & \cdots & G\_p_i \\ 0 & 0 & \cdots & REV\_G\_ENC_i \\ REV\_G\_ENC_{1l} & REV\_G\_ENC_{2(i-1)} & \cdots & REV\_G\_ENC_{i1} \end{bmatrix},$$

obtaining:

$$REV\_A_{\Delta i}^{-1} = \begin{bmatrix} A_1^{-1} & 0 & 0 & 0 \\ X_{1\_2} & A_2^{-1} & 0 & 0 \\ \cdots & \cdots & \cdots & 0 \\ X_{1\_i} & X_{2\_(i-1)} & \cdots & A_i^{-1} \end{bmatrix},$$

where $X_{1\_2}=A_2^{-1}B_{1\_2}A_1^{-1}, X_{a\_b}=A_b^{-1}B_{a\_b}A_a^{-1}+\Sigma_{k=a+1}^{b-1}A_b^{-1}B_{k\_b},$ where REV_$A_{\Delta i}$ represents a full-rank matrix composed of all sub-matrixes when the priority is i, $B_{1\_2}$ represents a sub-matrix $$\begin{bmatrix} 0 \\ 0 \\ REV\_G\_ENC_{12} \end{bmatrix},$$

$X_{1\_2}$ represents a sub-matrix after an inverse operation of a sub-matrix $B_{1\_2}$, $X_{a\_b}$ represents a sub-matrix obtained after an inverse operation of a sub-matrix $B_{a\_b}$, $B_{a\_b}$ represents a sub-matrix $$\begin{bmatrix} 0 \\ 0 \\ REV\_G\_ENC_{ab} \end{bmatrix},$$

the value range of a is 1 to i, the value range of b is 2 to i, and $A_i^{-1}$ represents an inverse matrix of a sub-matrix $$\begin{bmatrix} G\_p_i \\ REV\_G\_ENC_i \\ REV\_G\_ENC_{i1} \end{bmatrix};$$

making $$C_{i\_temp} = REV\_A_i^{-1} \begin{bmatrix} 0 \\ REV\_D_i \\ REV\_R_i \end{bmatrix},$$

where $$REV\_A_i = \begin{bmatrix} G\_p_i \\ REV\_G\_ENC_i \\ REV\_G\_ENC_{i1} \end{bmatrix},$$

and $REV\_A_i^{-1}$ is an inverse matrix of $REV\_A_i$ to obtain:

$$C_1 = C_{1\_temp}$$

$$C_2 = C_{2\_temp} + X_{1\_2}\begin{bmatrix} 0 \\ REV\_D_1 \\ REV\_R_1 \end{bmatrix} = C_{2\_temp} + A_2^{-1}B_{1\_2}C_1$$

$$C_3 = C_{3\_temp} + X_{1\_3}\begin{bmatrix} 0 \\ REV\_D_1 \\ REV\_R_1 \end{bmatrix} + X_{2\_3}\begin{bmatrix} 0 \\ REV\_D_2 \\ REV\_R_2 \end{bmatrix} =$$

$$C_{2\_temp} + A_3^{-1}B_{1\_3}C_1 + A_3^{-1}B_{2\_3}C_2$$

obtaining by mathematical induction:

$$C_i = C_{i\_temp} + \sum_{j=1}^{i-1} X_{j\_i}\begin{bmatrix} 0 \\ REV\_D_j \\ REV\_R_j \end{bmatrix} = C_{i\_temp} + \sum_{j=1}^{i-1} A_i^{-1}B_{j\_i}C_j$$

obtaining $C_1, C_2 \ldots C_i$, where $C_{i+1} \ldots C_l$ cannot be solved;

if cumFullRand(i)==1 is satisfied and cumFullRank(1:i)>0 is not satisfied, using a Gaussian elimination decoding method to solve $C_1$–$C_i$;

setting $$REV\_A_{\Delta i} = \begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 \ldots & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_i \\ 0 & 0 & \ldots & REV\_G\_ENC_i \\ REV\_G\_ENC_{1i} & REV\_G\_ENC_{2(i-1)} & \ldots & REV\_G\_ENC_{i1} \end{bmatrix},$$

and solving linear equations by a Gaussian elimination method:

$$\begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 \ldots & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_i \\ 0 & 0 & \ldots & REV\_G\_ENC_i \\ REV\_G\_ENC_{1i} & REV\_G\_ENC_{2(i-1)} & \ldots & REV\_G\_ENC_{i1} \end{bmatrix} \begin{bmatrix} C_1 \\ C_2 \\ \ldots \\ C_i \end{bmatrix} = \begin{bmatrix} 0 \\ REV\_D_1 \\ REV\_R_1 \\ 0 \\ REV\_D_2 \\ REV\_R_2 \\ \ldots \\ 0 \\ REV\_D_i \\ REV\_i \end{bmatrix},$$

obtaining $C_1, C_2 \ldots C_i$, where $C_{i+1} \ldots C_l$ cannot be solved, for any value of i, if cumFullRand(i)==1 is not satisfied, $C_i$ cannot be solved correspondingly, when cumFullRank(1:i)>0 is not satisfied until i==1, none of $C_1, C_2 \ldots C_i$ can be solved, and decoding fails; and step A4: decreasing the value of i by 1, and returning to step A3.

Preferably, the method further includes:

parsing importance information of a header of each sub-data packet in the source data packet;

mapping each sub-data packet in the source data packet into different priorities according to the importance information respectively;

rearranging the sub-data packets according to priorities of the sub-data packets to generate an intermediate data packet;

converting the intermediate data packet into a plurality of symbols, and performing FEC coding on the intermediate data packet converted into the plurality of symbols to obtain a recovery data packet including the plurality of symbols;

adding an index field and/or a priority indication field to the recovery data packet, the index field being configured to indicate a sequence of sub-data packets in the recovery data packet and/or indicate a sequence of sub-data packets in the recovery data packet under a priority corresponding to the priority indication field; also adding an index field and/or a priority indication field to the intermediate data packet, the index field being configured to indicate a sequence of sub-data packets in the intermediate data packet and/or indicate a sequence of sub-data packets in the intermediate data packet under a priority corresponding to the priority indication field;

adding corresponding indication information to the recovery data packet and the intermediate data packet, or sending corresponding indication information when sending the recovery data packet and the intermediate data packet, the indication information being configured to indicate sub-data packets of the recovery data packet under each priority and a number of sub-data packets belonging to the corresponding priority or a proportion of the sub-data packets in the recovery data packet, the indication information being further configured to indicate sub-data packets of the intermediate data packet under each priority and a number of sub-data packets belonging to the corresponding priority or a proportion of the sub-data packets in the intermediate data packet; and sending the recovery data packet and the intermediate data packet including the indication information to a terminal side, or sending the recovery data packet, the intermediate data packet and the corresponding indication information to the terminal side.

Preferably, parsing importance information of a header of each sub-data packet in the source data packet includes:

reading a priority field in a header of each sub-data packet, and determining a priority of the corresponding sub-data packet according to information in the priority field.

Preferably, mapping each sub-data packet in the source data packet into different preset priorities according to the importance information respectively includes:

determining the number of priorities actually adopted by the source data packet, and a mapping relationship with the priority field under each priority; and mapping the sub-data packets into the corresponding preset priorities according to the mapping relationship.

Preferably, the step of converting the intermediate data packet into a plurality of symbols and performing FEC coding on the intermediate data packet converted into the plurality of symbols to obtain a recovery data packet including the plurality of symbols includes:

performing FEC coding on the intermediate data packet by using an adaptive FEC coding mode of a RaptorQ systematic code to obtain the following intermediate codeword:

$$\begin{bmatrix} C_1 \\ C_2 \\ \ldots \\ C_N \end{bmatrix} = \begin{bmatrix} A_1^{-1} & 0 & \ldots & 0 \\ 0 & A_2^{-1} & \ldots & 0 \\ \ldots & \ldots & \ldots & \ldots \\ \ldots & \ldots & \ldots & A_N^{-1} \end{bmatrix} \begin{bmatrix} 0 \\ D_1 \\ 0 \\ D_2 \\ \ldots \\ 0 \\ D_N \end{bmatrix},$$

where $A_i$ represents a coding matrix corresponding to an $i^{th}$ source data packet, $C_1, C_2, \ldots, C_i \ldots, C_N$ correspond to intermediate codes of N types of source data packets respectively, $D_1, D_2, \ldots, D_i \ldots, D_N$ correspond to data of the N types of source data packets respectively, and a superscript $-1$ is an inverse matrix operator; and obtaining a recovery data packet according to the intermediate codeword, and adding an FEC payload ID to the recovery data packet, recovery data in the recovery data packet being as follows:

$$\begin{bmatrix} D_1 \\ D_2 \\ \ldots \\ D_N \\ R_1 \\ R_2 \\ \ldots \\ R_N \end{bmatrix} = \begin{bmatrix} G_{ENC_1} & 0 & \ldots & 0 \\ 0 & G_{ENC_2} & \ldots & 0 \\ \ldots & \ldots & \ldots & \ldots \\ 0 & \ldots & \ldots & G_{ENC_N} \\ G_{ENC_{11}} & 0 & \ldots & 0 \\ G_{ENC_{12}} & G_{ENC_{21}} & \ldots & 0 \\ \ldots & \ldots & \ldots & \ldots \\ G_{ENC_{1N}} & G_{ENC_{2(N-1)}} & \ldots & G_{ENC_{N1}} \end{bmatrix} \begin{bmatrix} C_1 \\ C_2 \\ \ldots \\ C_N \end{bmatrix},$$

where $R_1, R_2, \ldots, R_i \ldots, R_N$ correspond to recovery data of 1-N source data packets respectively, $G\_ENC_i$ represents an LT coding matrix corresponding to an $i^{th}$ source data packet, $G\_ENC_{1i}$ represents an LT coding matrix with the same generation rule as $G\_ENC_1$, $G\_ENC_{i1}$ represents an LT coding matrix with the same generation rule as $G\_ENC_i$, and i=1, 2, ... N.

A media content-based adaptive method for FEC coding and decoding of a systematic code provided according to the present invention includes:

receiving a recovery data packet and an intermediate data packet sent by a server, or receiving a recovery data packet, intermediate data and corresponding indication information;

parsing index fields contained in the recovery data packet and the intermediate data packet, and generating a coding matrix according to the index fields, the index field being configured to indicate a sequence of sub-data packets in the recovery data packet and indicate sub-data packets of the intermediate data packet under each priority; or, directly acquiring index information through priority indication fields of the recovery data packet and the intermediate data packet, and generating a coding matrix according to the index information, the index information being configured to indicate a sequence of sub-data packets in the recovery data packet and indicate sub-data packets of the intermediate data packet under each priority;

performing FEC decoding on the coding matrix to recover the intermediate data packet; and parsing header information of the intermediate data packet, rearranging the sub-data packets of the intermediate data packet, and recovering a source data packet.

Preferably, parsing the index fields contained in the recovery data packet and the intermediate data packet includes:

obtaining an index field of a corresponding row of a coding matrix corresponding to source data by the following formula:

index=FECpayloadID−Numberofpacketsofallpriori-
tiesbeforethispacket, where index represents a corresponding row index of a coding matrix corresponding to source data, FEC payload ID represents index information of a data packet header, and number of packets of all priorities before this packet represents the total number of data packets of all priorities before this data packet.

Preferably, performing FEC decoding on the coding matrix to recover the intermediate data packet includes:

performing elementary row transformation on the coding matrix, sorting symbols in the received corresponding recovery data packet, and determining, according to a value of index information FEC_payload_ID of a recovered data packet header and the number of symbols under a corresponding priority, the priority of the symbol and a transformed position; or, directly determining, according to a priority field in a recovered data packet header and index information of the priority field under a corresponding priority, the priority of the symbol and a transformed position;

adjusting a sequence of the symbols in the recovery data packet, and decoding through a Gaussian elimination decoder and an RFC6330 decoder to obtain a recovered intermediate data packet including a plurality of symbols; and converting the intermediate data packet including the plurality of symbols into an intermediate data packet.

A media content-based adaptive device for FEC coding and decoding of a systematic code provided according to the present invention includes:

a parsing module, configured to parse importance information of a header of each sub-data packet in a source data packet;

a mapping module, configured to map each sub-data packet in the source data packet into different preset priorities according to the importance information respectively;

a sorting module, configured to rearrange the sub-data packets according to the preset priorities to obtain an intermediate data packet;

a coding module, configured to convert the intermediate data packet into a plurality of symbols, and perform FEC coding on the intermediate data packet converted into the plurality of symbols to obtain a recovery data packet including the plurality of symbols;

an index module, configured to add an index field and/or a priority indication field to the recovery data packet, the index field being configured to indicate a sequence of sub-data packets in the recovery data packet and/or indicate a sequence of sub-data packets in the recovery data packet under a priority corresponding to the priority indication field; and also add an index field and/or a priority indication field to the intermediate data packet, the index field being configured to indicate a sequence of sub-data packets in the intermediate data packet and/or indicate a sequence of sub-data packets in the intermediate data packet under a priority corresponding to the priority indication field;

an indication information generating module, configured to add corresponding indication information to the recovery data packet and the intermediate data packet, or send corresponding indication information when sending the recovery data packet and the intermediate data packet, the indication information being configured to indicate sub-data packets of the recovery data packet under each priority and a number of sub-data packets belonging to the corresponding priority or a proportion of the sub-data packets in the recovery data packet, the indication information being further configured to indicate sub-data packets of the intermediate data packet under each priority and a number of sub-data packets belonging to the corresponding priority or a proportion of the sub-data packets in the intermediate data packet; and a sending module, configured to send the recovery data packet, the intermediate data packet and corresponding signaling information to a terminal side, or send the recovery data packet, the intermediate data packet and the corresponding indication information to the terminal side.

Preferably, the coding module is specifically configured to:

perform FEC coding on the intermediate data packet by using an adaptive FEC coding mode of a RaptorQ systematic code to obtain the following intermediate codeword:

$$\begin{bmatrix} C_1 \\ C_2 \\ \ldots \\ C_N \end{bmatrix} = \begin{bmatrix} A_1^{-1} & 0 & \ldots & 0 \\ 0 & A_2^{-1} & \ldots & 0 \\ \ldots & \ldots & \ldots & \ldots \\ \ldots & \ldots & \ldots & A_N^{-1} \end{bmatrix} \begin{bmatrix} 0 \\ D_1 \\ 0 \\ D_2 \\ \ldots \\ 0 \\ D_N \end{bmatrix},$$

where $A_i$ represents a coding matrix corresponding to an $i^{th}$ source data packet, $C_1, C_2, \ldots, C_i \ldots, C_N$ correspond to intermediate codes of N types of source data packets respectively, $D_1, D_2, \ldots, D_i \ldots, D_N$ correspond to data of the N types of source data packets respectively, and a superscript −1 is an inverse matrix operator; and obtain a recovery data packet according to the intermediate codeword, and add an FEC payload ID to the recovery data packet, recovery data in the recovery data packet being as follows:

$$\begin{bmatrix} D_1 \\ D_2 \\ \ldots \\ D_N \\ R_1 \\ R_2 \\ \ldots \\ R_N \end{bmatrix} = \begin{bmatrix} G_{ENC_1} & 0 & \ldots & 0 \\ 0 & G_{ENC_2} & \ldots & 0 \\ \ldots & \ldots & \ldots & \ldots \\ 0 & \ldots & \ldots & G_{ENC_N} \\ G_{ENC_{11}} & 0 & \ldots & 0 \\ G_{ENC_{12}} & G_{ENC_{21}} & \ldots & 0 \\ \ldots & \ldots & \ldots & \ldots \\ G_{ENC_{1N}} & G_{ENC_{2(N-1)}} & \ldots & G_{ENC_{N1}} \end{bmatrix} \begin{bmatrix} C_1 \\ C_2 \\ \ldots \\ C_N \end{bmatrix},$$

where $R_1, R_2, \ldots, R_i \ldots, R_N$ correspond to recovery data of 1-N source data packets respectively, $G\_ENC_i$ represents an LT coding matrix corresponding to an $i^{th}$ source data packet, $G\_ENC_{1i}$ represents an LT coding matrix with the same generation rule as $G\_ENC_1$, $G\_ENC_{i1}$ represents an LT coding matrix with the same generation rule as $G\_ENC_i$, and i=1, 2, ... N.

A media content-based adaptive device for FEC coding and decoding of a systematic code provided according to the present invention includes:

a receiving module, configured to receive a recovery data packet and an intermediate data packet sent by a server, or receive a recovery data packet, an intermediate data packet and corresponding indication information;

a coding matrix generating module, configured to: parse index fields contained in the recovery data packet and the intermediate data packet, and generate a coding matrix according to the index fields, the index field being configured to indicate a sequence of sub-data packets in the recovery data packet and indicate sub-data packets of the intermediate data packet under each priority; or, directly acquire index information through priority indication fields of the recovery data packet and the intermediate data packet, and generate a coding matrix according to the index information, the index information being configured to indicate a sequence of sub-data packets in the recovery data packet and indicate sub-data packets of the intermediate data packet under each priority;

a decoding module, configured to perform FEC decoding on the coding matrix to recover the intermediate data packet; and a recovery module, configured to parse header information of the intermediate data packet, rearrange the sub-data packets of the intermediate data packet, and recover a source data packet.

Preferably, the coding matrix generating module is specifically configured to:

obtain an index field of a corresponding row of a coding matrix corresponding to source data by the following formula:

index=FECpayloadID−numberofpacketsofallpriori-
tiesbeforethispacket, where index represents a corresponding row index of a coding matrix corresponding to source data, FEC payload ID represents index information of a data packet header, and number of packets of all priorities before this packet represents the total number of data packets of all priorities before this data packet.

Preferably, the decoding module is specifically configured to:

perform elementary row transformation on the coding matrix, sort symbols in the received corresponding recovery data packet, and determine, according to a value of index information FEC_payload_ID of a recovered data packet header and the number of symbols under a corresponding priority, the priority of the symbol and a transformed position; or, directly determine, according to a priority field in a recovered data packet header and index information of the priority field under a corresponding priority, the priority of the symbol and a transformed position;

adjust a sequence of the symbols in the recovery data packet, and decode through a Gaussian elimination decoder and an RFC6330 decoder to obtain a recovered intermediate data packet including a plurality of symbols; and convert the intermediate data packet including the plurality of symbols into an intermediate data packet.

A media content-based adaptive system for FEC coding and decoding of a systematic code provided according to the present invention includes a server and at least one terminal. The server is configured to perform the media content-based adaptive method for FEC coding and decoding of the systematic code according to any one of claims 7 to 10. The terminal is configured to perform the media content-based adaptive method for FEC coding and decoding of the systematic code according to any one of claims 11 to 13.

A computer-readable storage medium storing a computer program is provided according to the present invention. The computer program is executed by a processor to implement the steps of an image-based stripe cloth detecting, positioning and cutting method according to any one of claims 7 to 13.

Compared with the conventional art, the present invention has the following beneficial effects.

According to the media content-based adaptive method for FEC of the systematic code provided by the present invention, sorting is performed according to priorities based on the importance of media content, Unequal Error Protection (UEP) is adopted, and the quality of the media content is ensured to the greatest extent while data redundancy caused by FEC is reduced. A systematic code is more flexibly coded and decoded. It is not necessary to shunt a source data stream, which reduces the complexity of FEC coding at a sending end and improves the efficiency of FEC coding. Meanwhile, a coding scheme can be dynamically adjusted according to a change in a current network state, and the adaptability to time-varying networks is stronger.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

Other features, objectives, and advantages of the present invention will become more obvious by reading the detailed description of nonlimitative embodiments that is provided with reference to the following accompanying drawings.

DETAILED DESCRIPTION

Figure 1:
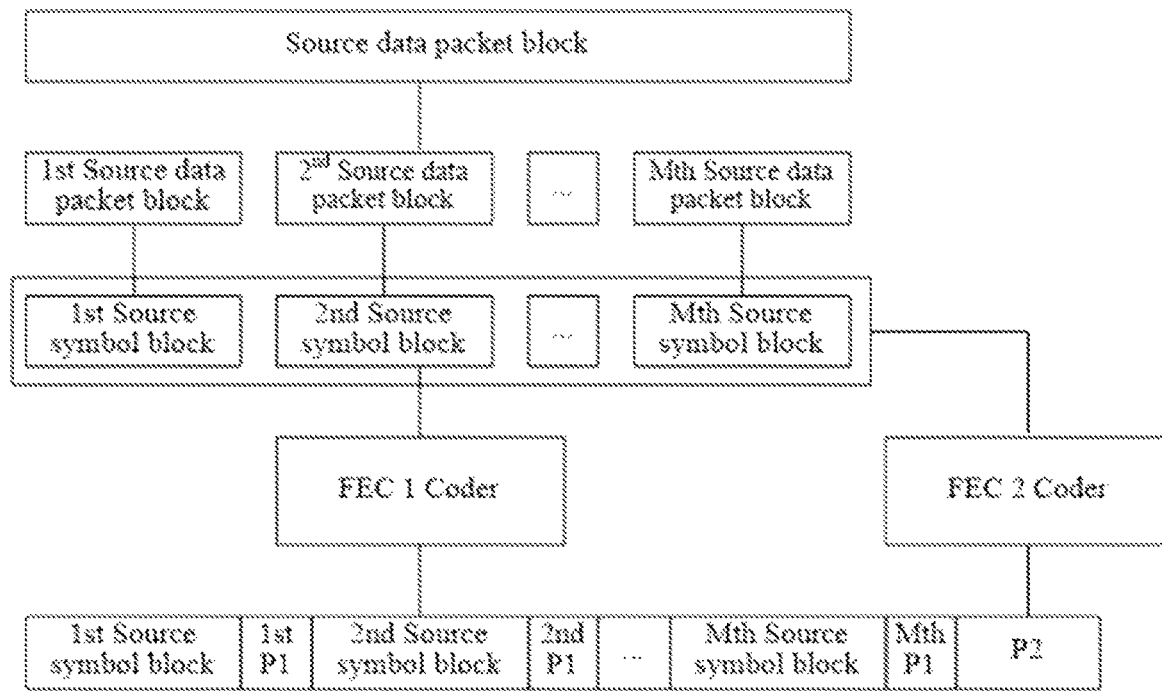
FIG. 1 is a schematic diagram of a two-layer structure of FEC for media resource data.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure is thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It is appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the invention or of any exemplified term. Likewise, the invention is not limited to various embodiments given in this specification.

It is understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It is understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present invention.

It is understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is also appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the invention. As used herein, the singular forms "a," "an," and "the" are intended to include the plural forms as well, unless the context clearly indicates otherwise. It is further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It is understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It is further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, preferably within 10 percent, and more preferably within 5 percent of a given value or range. Numerical quantities given herein are approximate, meaning that the terms "around," "about," "substantially" or "approximately" can be inferred if not expressly stated.

As used herein, the terms "comprise" or "comprising," "include" or "including," "carry" or "carrying," "has/have" or "having," "contain" or "containing," "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the invention.

Embodiments of the invention are illustrated in detail hereinafter with reference to accompanying drawings. It should be understood that specific embodiments described herein are merely intended to explain the invention, but not intended to limit the invention.

The following describes the present invention in detail with reference to specific embodiments. The following embodiments will help those skilled in the art to further understand the present invention, but are not intended to limit the present invention in any form. It should be noted that for those of ordinary skill in the art, various changes and improvements may be made without departing from the concept of the present invention, and such changes or improvements shall fall within the protection scope of the present invention.

In the following, some terms in this application are described, so as to help persons skilled in the art have a better understanding.

1) Unequal Error Protection (UEP) is a type of joint source channel coding. The core idea is that according to different importance levels of various data of a code stream, different channel protection mechanisms are adopted for various data, that is, important code streams are subject to key protection. Although the UEP reduces the anti-noise performance of non-important code streams, it is beneficial to improvement of the overall error-resisting performance of the system.

2) During the transmission process of a digital fountain code, feedback and automatic retransmission mechanisms are not required, thereby avoiding the delay of a signal round trip and the problem of feedback explosions in broadcasting applications. The basic idea of a digital fountain is that: the sending end divides original data into k data symbols, codes the data symbols, and outputs a coded symbol code stream of any length; and the receiving end only needs to correctly receive n (slightly greater than k) coded symbols to recover all the k data symbols with a large probability.

The digital fountain code itself has UEP performance, which may achieve protection of data of different importance levels. Compared with a traditional fixed-code rate channel coding method, the digital fountain code has the following obvious advantages.

a. The expandability is ideal. Since there is no feedback in one-way broadcast, a sender is free of any influence of increase in the number of users. The sender is enabled to serve any number of users.

b. It adapts to time-varying channels and uses channel capacity efficiently. The decoding performance of users is unrelated to the deletion probability and bandwidth of channels. When the channels have high packet loss rate and are in bad condition, the decoding of a receiving end cannot be affected, that is, the receiving end may decode normally after receiving a sufficient amount of coded data, which has stronger adaptability.

c. The complexity of coding and decoding is low. In an ideal case, each coded symbol generated by a fountain code has linear coding and decoding complexity, which is helpful for simplifying the design and software implementation of a codec at a transceiver end.

d. The applicability to heterogeneous users is good. The non-bit rate characteristic of the fountain code makes users with different packet loss rates or bandwidths not affect each other, and high-quality users are not restrained by low-quality users. In addition, a digital fountain code may support a variety of service modes such as interrupted continuous transmission and asynchronous access.

As shown in FIG. 1, for a two-layer structure of FEC for media resource data, the first layer divides a source packet block into more small blocks for FEC protection respectively, and the second layer is a whole block for FEC protection. The first layer is more detailed and may provide less delay. The second layer guarantees recovery performance and less redundancy. However, this mode requires two FEC coding operations, which reduces coding efficiency and lacks flexibility.

Figure 2:
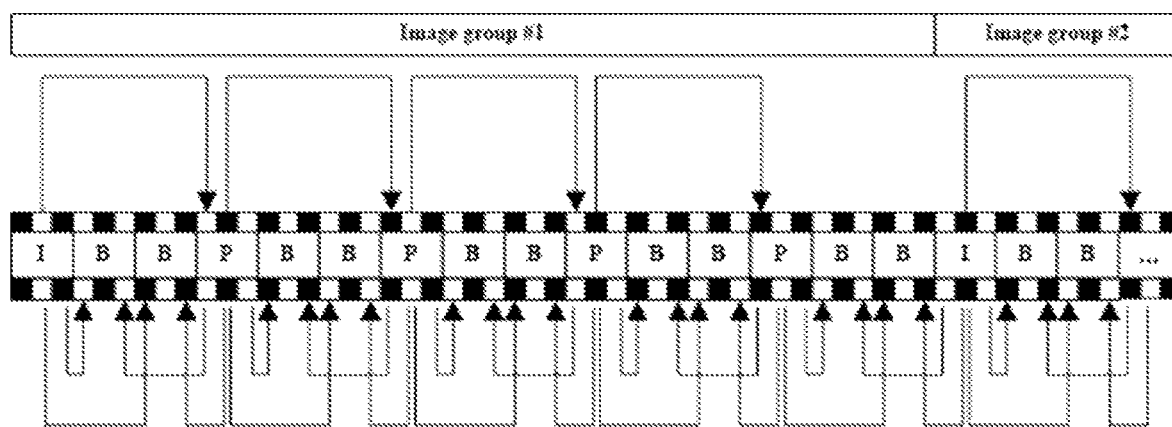
FIG. 2 and FIG. 3 are schematic diagrams of dependency between frames in an image group.
Figure 3:
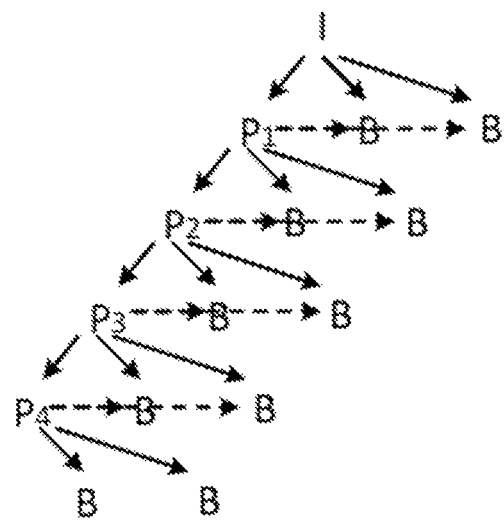
Figure 4:
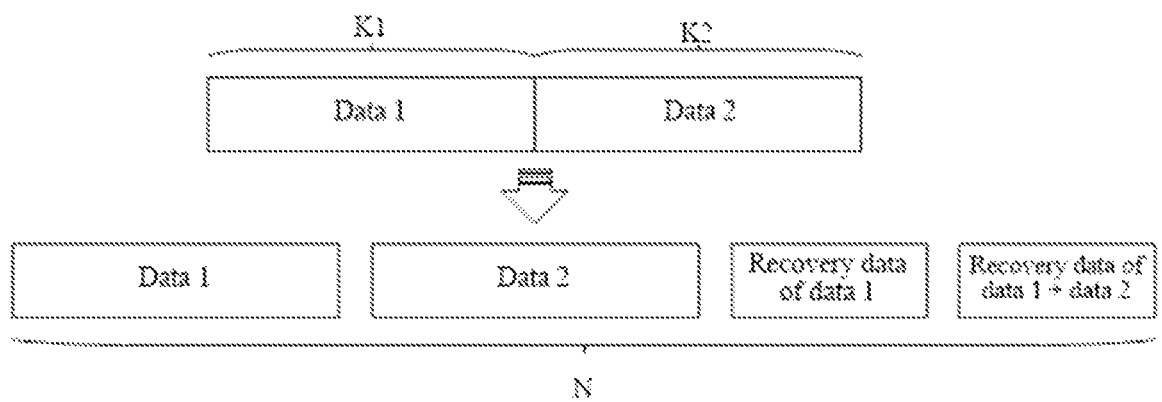
FIG. 4 is a schematic diagram of an Unequal Error Protection (UEP) coding scheme for a fountain code.
Figure 5:
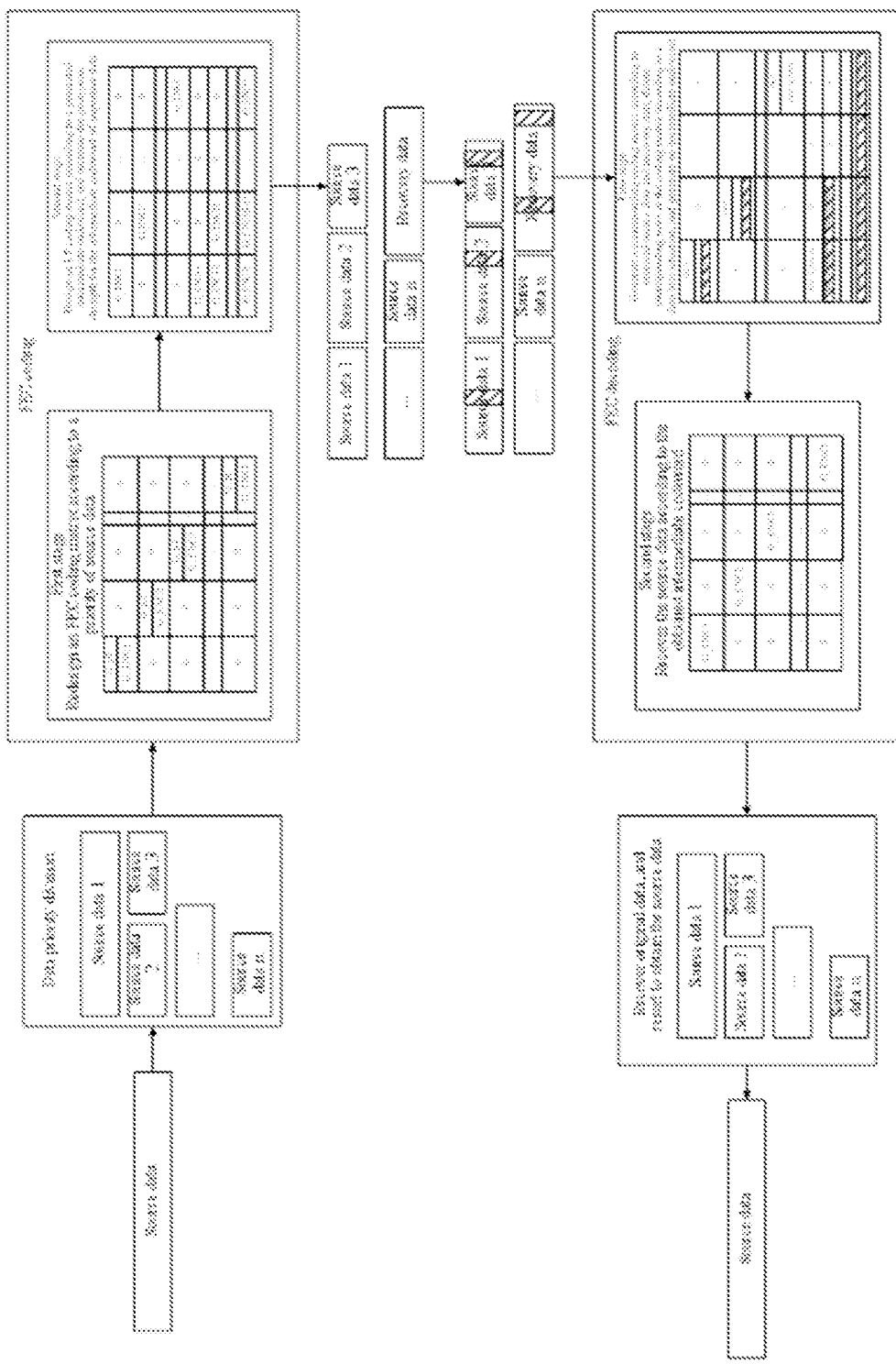
FIG. 5 is a schematic diagram of a system architecture of UEP for a fountain code.

A data stream may be divided into different types of data packets according to their contents, and different types of data packets have different importance levels. For example, the importance levels of I, B, and P frames in a data packet are shown in FIG. 2 and FIG. 3. A dependency of each frame in an image group indicates that the dependency and importance of different frames in an image group are different. The I frame is the most important, and the B and P frames are less important. Therefore, UEP may be performed according to the importance of data content. Specifically, considering the case where source data is transmitted in two important levels, the source data is divided according to the above standards and resorted according to the importance. By changing the structure of a coding matrix of a systematic fountain code, UEP for different content may be achieved. The basic architecture of the system is shown in FIG. 5. Data generated after the UEP of the systematic fountain code is shown in FIG. 4.

Embodiment 1

Figure 6:
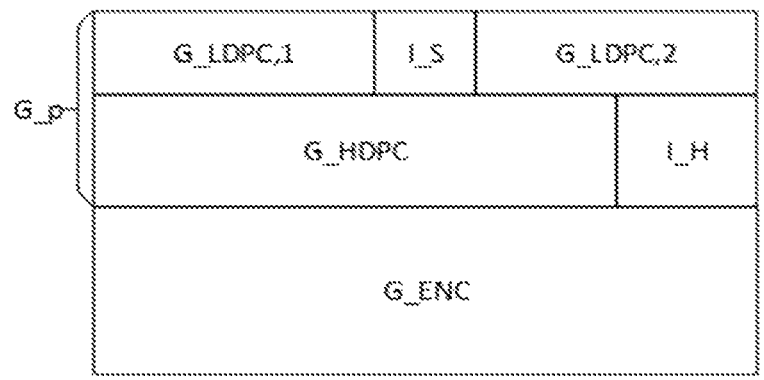
FIG. 6 is a schematic structural diagram of a coding matrix of a systematic RaptorQ code.

This embodiment takes a systematic RaptorQ code as an example. The structure of a coding matrix of the systematic RaptorQ code is shown in FIG. 6. D represents source data, C represents an intermediate code, G_LDPC represents an LDPC matrix, I_S and I_H represent identity matrices, and G_ENC represents an LT coding matrix. Then, the coding matrix may be expressed as follows.

$$G\_p = \begin{bmatrix} G\_LDPC, 1\ I\_S & G\_LDPC, 2 \\ G\_HDPC & I\_H \end{bmatrix} \quad (1)$$

$$A = \begin{bmatrix} G\_p \\ G\_ENC \end{bmatrix} \quad (2)$$

When FEC coding is performed, an intermediate code is generated from the source data and the coding matrix shown in FIG. 6.

$$C = A^{-1} \times \begin{bmatrix} 0 \\ D \end{bmatrix} \quad (3)$$

Source data and recovery data are generated according to an LT matrix in the coding matrix and the obtained intermediate code. R represents the recovery data obtained after coding, and G_ENC' is an LT matrix generated in the same generation mode as G_ENC.

$$\begin{bmatrix} D \\ R \end{bmatrix} = \begin{bmatrix} G\_ENC \\ G\_ENC' \end{bmatrix} \times C \quad (4)$$

The above method is used to code the source data, the source data cannot be prioritized and UEP coding is used, so a matrix structure of a coding matrix A and an LT matrix G_ENC needs to be redesigned. For example, the source data has two different priorities namely priorities 1 and 2, respectively, and data of different priorities in the source data are distinguished and assigned with different redundancies. A UEP effect has been achieved.

Figure 7:
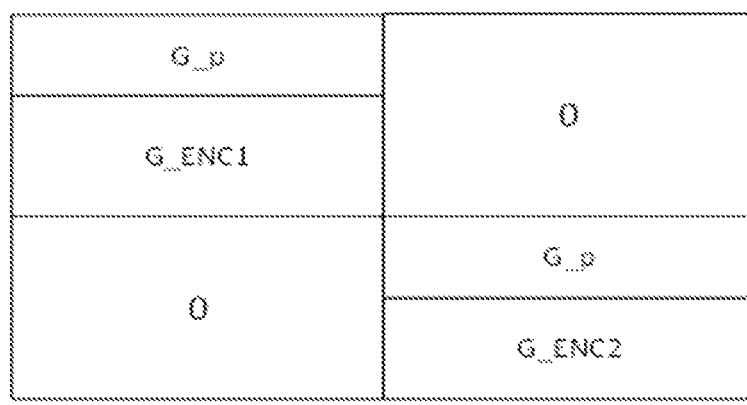
FIG. 7 is a schematic structural diagram of a coding matrix of systematic RaptorQ code UEP.

Coding Process:

The coding matrix structure thereof is shown in FIG. 7. The coding matrix thereof is shown in formula (6). $G\_ENC_1$ and $G\_ENC_2$ are coding matrices generated by different rules. In order to ensure the protection of important data, the degree distribution of the matrix $G\_ENC_1$ may be improved.

$$A_i = \begin{bmatrix} G\_p_i \\ G\_ENC_i \end{bmatrix} i = 1, 2 \quad (5)$$

$$A = \begin{bmatrix} G\_p_1 & 0 \\ G\_ENC_1 & 0 \\ 0 & G\_p_2 \\ 0 & G\_ENC_2 \end{bmatrix} \quad (6)$$

In this way, corresponding intermediate codes may be generated for data of different importance levels.

$$\begin{bmatrix} C_1 \\ C_2 \end{bmatrix} = \begin{bmatrix} A_1^{-1} & 0 \\ 0 & A_2^{-1} \end{bmatrix} \begin{bmatrix} 0 \\ D_1 \\ 0 \\ D_2 \end{bmatrix} \quad (7)$$

Figure 8:
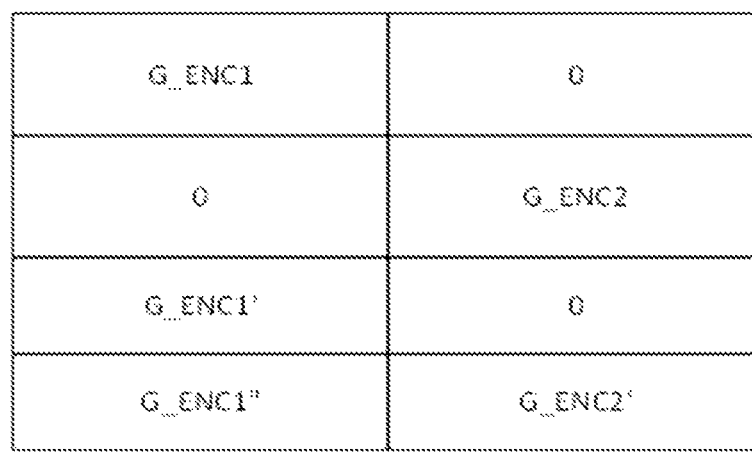
FIG. 8 is a schematic structural diagram of UEP of an LT coding matrix.

In order to achieve UEP for data of different importance levels, the structure of the LT coding matrix needs to be changed as shown in FIG. 8, and redundant data for important data protection is added. $G\_ENC_1'$ has the same generation mode as $G\_ENC_1$, and $G\_ENC_2'$ has the same generation mode as $G\_ENC_2$. The obtained recovery data R1 is only related to data with a priority of 1, and the recovery data R is related to both data with a priority of 1 and data with a priority of 2. Therefore, the redundancy of important data is increased, and the protection intensity is improved. If the total redundancy of the data is limited due to the limitation of channel conditions, the ratio of generating $R_1$ and $R_2$ is determined by a row number ratio of $[G\_ENC_1' \; 0]$ and $[G\_ENC_1'' \; G\_ENC_2^1]$. The row number of $[G\_ENC_i' 0]$ may be increased to further improve the protection intensity of data with a priority of 1.

$$\begin{bmatrix} D_1 \\ D_2 \\ R_1 \\ R_2 \end{bmatrix} = \begin{bmatrix} G\_ENC_1 & 0 \\ 0 & G\_ENC_2 \\ G\_ENC_1' & 0 \\ G\_ENC_1'' & G\_ENC_2' \end{bmatrix} \begin{bmatrix} C_1 \\ C_2 \end{bmatrix} \quad (8)$$

Decoding Process:

Since some data packets are lost after passing through a loss channel, a recovery matrix is generated according to a received symbol ISI, and matrix rows corresponding to the lost symbol ISI need to be erased. For example, for a matrix $REV\_G\_ENC_1$, the ISI of the lost data may be obtained according to the received $REV\_D_1$ and $D_1$ at a sending end, thus deleting the corresponding rows of $G\_ENC_1$. Similar to the coding process, during the first stage of decoding, an intermediate codeword is obtained according to the recovery matrix and the received data packet.

$$\begin{bmatrix} G\_p_1 & 0 \\ REV\_G\_ENC_1 & 0 \\ 0 & G\_p_2 \\ 0 & REV\_G\_ENC_2 \\ REV\_G\_ENC_1' & 0 \\ REV\_G\_ENC_1'' & REV\_G\_ENC_2' \end{bmatrix} \begin{bmatrix} C_1 \\ C_2 \end{bmatrix} = \begin{bmatrix} 0 \\ REV\_D_1 \\ 0 \\ REV\_D_2 \\ REV\_R_1 \\ REV\_R_2 \end{bmatrix} \quad (9)$$

The elementary row transformation is performed on the above matrix equation to obtain the following form:

$$\begin{bmatrix} G\_p_1 & 0 \\ REV\_G\_ENC_1 & 0 \\ REV\_G\_ENC_1' & 0 \\ 0 & G\_p_2 \\ 0 & REV\_G\_ENC_2 \\ REV\_G\_ENC_1'' & REV\_G\_ENC_2' \end{bmatrix} \begin{bmatrix} C_1 \\ C_2 \end{bmatrix} = \begin{bmatrix} 0 \\ REV\_D_1 \\ REV\_R_1 \\ 0 \\ REV\_D_2 \\ REV\_R_2 \end{bmatrix} \quad (10)$$

$$REV\_A = \begin{bmatrix} G\_p_1 & 0 \\ REV\_G\_ENC_1 & 0 \\ REV\_G\_ENC_1' & 0 \\ 0 & G\_p_2 \\ 0 & REV\_G\_ENC_2 \\ REV\_G\_ENC_1'' & REV\_G\_ENC_2' \end{bmatrix},$$

and decoding is performed according to the number of received source data packets under each priority and the total number of received data packets in different situations.

The total number of received coded symbols is less than the number of coded symbols of source data, and a row number of $$REV\_A_1 = \begin{bmatrix} G\_p_1 \\ REV\_G\_ENC_1 \\ REV\_G\_ENC_1' \end{bmatrix}$$

is less than a column number. $C_1$ and $C_2$ cannot be solved.

The total number of received coded symbols is less than the number of coded symbols of source data, but a row number of $$REV\_A_1 = \begin{bmatrix} G\_p_1 \\ REV\_G\_ENC_1 \\ REV\_G\_ENC_1' \end{bmatrix}$$

is greater than or equal to a column number.

If the row number of $$REV\_A_1 = \begin{bmatrix} G\_p_1 \\ REV\_G\_ENC_1 \\ REV\_G\_ENC_1' \end{bmatrix}$$

is greater than or equal to the column number, $REV\_A_1$ is reversible, and an inverse matrix thereof is denoted as $REV\_A_1^{-1}$ to obtain:

$$[C_1] = REV\_A^{-1} \begin{bmatrix} 0 \\ REV\_D_1 \\ REV\_R_1 \end{bmatrix} \quad (11)$$

But $C_2$ cannot be solved.

The total number of received coded symbols is greater than the number of coded symbols of source data, and the row number of $$REV\_A_1 = \begin{bmatrix} G\_p_1 \\ REV\_G\_ENC_1 \\ REV\_G\_ENC_1' \end{bmatrix}$$

is greater than or equal to the column number.

If the row number of $$REV\_A_1 = \begin{bmatrix} G\_p_1 \\ REV\_G\_ENC_1 \\ REV\_G\_ENC_1' \end{bmatrix}$$

is greater than or equal to the column number, $REV\_A_1$ is reversible, and an inverse matrix thereof is denoted as $REV\_A_1^{-1}$. If a row number of $$REV\_A_2 = \begin{bmatrix} G\_p_2 \\ REV\_G\_ENC_2 \\ REV\_G\_ENC_2' \end{bmatrix}$$

is greater than or equal to a column number, $REV\_A_2$ is reversible, and an inverse matrix thereof is denoted as $REV\_A_2^{-1}$. If $REV\_A_1$ and $REV\_A_2$ are both reversible, $REV\_A$ is reversible, and an inverse matrix thereof is denoted as $$REV\_A^{-1} \cdot B_{1\_1} = \begin{bmatrix} 0 \\ 0 \\ REV\_G\_ENC_1'' \end{bmatrix},$$

and it is easy to know $$REV\_A^{-1} = \begin{bmatrix} REV\_A_1^{-1} & 0 \\ REV\_A_2^{-1} B_{1\_1} REV\_A_1^{-1} & REV\_A_2^{-1} \end{bmatrix},$$

so as to obtain:

$$\begin{bmatrix} C_1 \\ C_2 \end{bmatrix} = REV\_A^{-1} \begin{bmatrix} 0 \\ REV\_D_1 \\ REV\_R_1 \\ 0 \\ REV\_D_2 \\ REV\_R_2 \end{bmatrix} = \qquad (12)$$

$$\begin{bmatrix} REV\_A_1^{-1} & 0 \\ REV\_A_2^{-1} B_{1\_1} REV\_A_1^{-1} & REV\_A_2^{-1} \end{bmatrix} \begin{bmatrix} 0 \\ REV\_D_1 \\ REV\_R_1 \\ 0 \\ REV\_D_2 \\ REV\_R_2 \end{bmatrix}$$

But if the row number of $$REV\_A_2 = \begin{bmatrix} G\_p_2 \\ REV\_G\_ENC_2 \\ REV\_G\_ENC_2' \end{bmatrix}$$

is less than the column number, there is no inverse matrix in $REV\_A_2$, and it only obtains $$[C_1] = REV\_A^{-1} \begin{bmatrix} 0 \\ REV\_D_1 \\ REV\_R_1 \end{bmatrix}.$$

The total number of received coded symbols is greater than or equal to the number of coded symbols of source data, the row number of $$REV\_A_1 = \begin{bmatrix} G\_p_1 \\ REV\_G\_ENC_1 \\ REV\_G\_ENC_1' \end{bmatrix}$$

is less than the column number, but the row number of $$REV\_A_2 = \begin{bmatrix} G\_p_2 \\ REV\_G\_ENC_2 \\ REV\_G\_ENC_2' \end{bmatrix}$$

is greater than or equal to the column number.

A Gaussian elimination method is used to directly solve a matrix REV_A, which solves the following linear equations:

$$\begin{bmatrix} G\_p_1 & 0 \\ REV\_G\_ENC_1 & 0 \\ REV\_G\_ENC_1' & 0 \\ 0 & G\_p_2 \\ 0 & REV\_G\_ENC_2 \\ REV\_G\_ENC_1'' & REV\_G\_ENC_2' \end{bmatrix} \begin{bmatrix} C_1 \\ C_2 \end{bmatrix} = \begin{bmatrix} 0 \\ REV\_D_1 \\ REV\_R_1 \\ 0 \\ REV\_D_2 \\ REV\_R_2 \end{bmatrix}. \qquad (13)$$

$C_1$ and $C_2$ are easily obtained.

It can be obtained from the first stage of the above-mentioned decoding process. In any case, the correct solution of $C_1$ is first guaranteed. Since the intermediate codewords $C_1$ and $C_2$ are important data to recover the source data in the second stage of decoding, and the decoding success rate of $C_1$ is improved to further increase the probability of correct recovery of the source data.

A coded symbol of a systematic code is generated according to the obtained intermediate codeword.

$$\begin{bmatrix} D_1 \\ D_2 \end{bmatrix} = \begin{bmatrix} G\_ENC_1 & 0 \\ 0 & G\_ENC_2 \end{bmatrix} \begin{bmatrix} C_1 \\ C_2 \end{bmatrix} \qquad (14)$$

If $C_1$ and $C_2$ are not obtained in the first stage, the decoding fails, and a source symbol cannot be decoded. If only $C_1$ is obtained, priority source code data $D_1$ may be correctly decoded. If both $C_1$ and $C_2$ are obtained, the above formula is used to obtain final source codes $D_1$ and $D_2$.

Meanwhile, this scheme is not only applicable to two priority scenarios, but may be expanded to a plurality of priority source data. The specific process is as follows.

Coding Process:

First, an intermediate codeword is generated according to source data and a priority of the source data. It is assumed that the source data is divided into/data packets to obtain:

$$\begin{bmatrix} G\_p_1 & 0 & \ldots & 0 \\ G\_ENC_1 & 0 & \ldots & 0 \\ 0 & G\_p_2 & \ldots & 0 \\ 0 & G\_ENC_2 & \ldots & 0 \\ \ldots & \ldots & \ldots & \ldots \\ 0 & 0 & \ldots & G\_p_l \\ 0 & 0 & \ldots & G\_ENC_l \end{bmatrix} \begin{bmatrix} C_1 \\ C_2 \\ \ldots \\ C_l \end{bmatrix} = \begin{bmatrix} 0 \\ D_1 \\ 0 \\ D_2 \\ \ldots \\ 0 \\ D_l \end{bmatrix} \qquad (15)$$

Intermediate codewords $C_1, C_2, \ldots, C_l$ may be obtained by formula (16).

$$\begin{bmatrix} C_1 \\ C_2 \\ \ldots \\ C_l \end{bmatrix} = \begin{bmatrix} A_1^{-1} & 0 & \ldots & 0 \\ 0 & A_2^{-1} & \ldots & 0 \\ \ldots & \ldots & \ldots & \ldots \\ \ldots & \ldots & \ldots & A_l^{-1} \end{bmatrix} \begin{bmatrix} 0 \\ D_1 \\ 0 \\ D_2 \\ \ldots \\ 0 \\ D_l \end{bmatrix} \qquad (16)$$

Source data and recovery data are generated according to the obtained intermediate codes.

$$\begin{bmatrix} D_1 \\ D_2 \\ \ldots \\ D_l \\ R_1 \\ R_2 \\ \ldots \\ R_l \end{bmatrix} = \begin{bmatrix} G\_ENC_1 & 0 & \ldots & 0 \\ 0 & G\_ENC_2 & \ldots & 0 \\ \ldots & \ldots & \ldots & \ldots \\ 0 & 0 & \ldots & G\_ENC_l \\ G\_ENC_{11} & 0 & \ldots & 0 \\ G\_ENC_{12} & G\_ENC_{21} & \ldots & 0 \\ \ldots & \ldots & \ldots & \ldots \\ G\_ENC_{1l} & G\_ENC_{2(l-1)} & \ldots & G\_ENC_{l1} \end{bmatrix} \begin{bmatrix} C_1 \\ C_2 \\ \ldots \\ C_l \end{bmatrix} \qquad (17)$$

Figure 9:
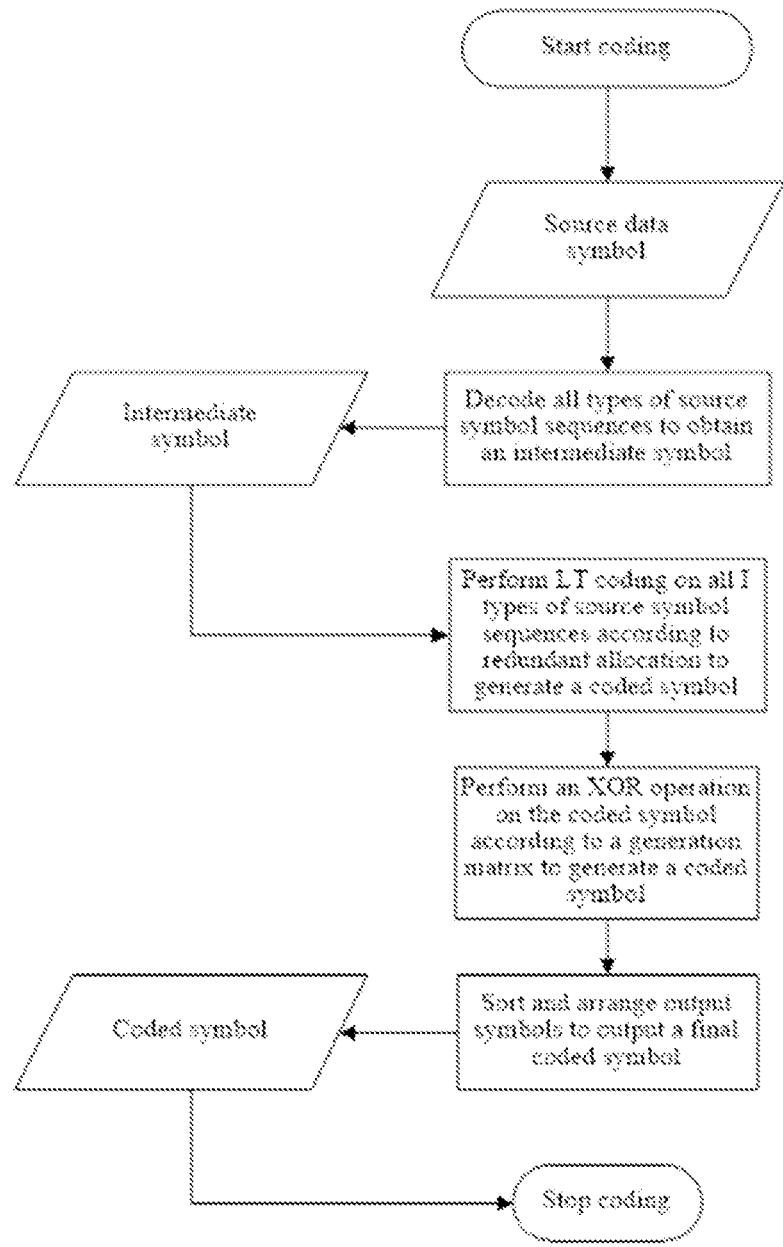
FIG. 9 is a flowchart of systematic fountain code coding of multi-priority UEP.

The whole coding process is shown in FIG. 9. The source data and the recovery data are sent from a sending end to a receiving end. Due to the attenuation of a channel, some data may be lost. After receiving the data, the receiving end decodes according to the received data situation to recover the source data.

Decoding Process:

Due to the loss of some data, a recovery matrix needs to be generated according to received symbols ISI, which is equivalent to erasing matrix rows corresponding to the lost symbols ISI to form a corresponding matrix, denoted as REV_G_ENC. According to different numbers of received data, intermediate codewords are generated in different situations.

$$\begin{bmatrix} G\_p_1 & 0 & \ldots & 0 \\ REV\_G\_ENC_1 & 0 & \ldots & 0 \\ 0 & G\_p_2 & \ldots & 0 \\ 0 & REV\_G\_ENC_2 & \ldots & 0 \\ \ldots & \ldots & \ldots & \ldots \\ 0 & 0 & \ldots & G\_p_l \\ 0 & 0 & \ldots & REV\_G\_ENC_l \\ REV\_G\_ENC_{11} & 0 & \ldots & 0 \\ REV\_G\_ENC_{12} & REV\_G\_ENC_{21} & \ldots & 0 \\ \ldots & \ldots & \ldots & \ldots \\ REV\_G\_ENC_{1l} & REV\_G\_ENC_{2(l-1)} & \ldots & REV\_G\_ENC_{l1} \end{bmatrix} \begin{bmatrix} C_1 \\ C_2 \\ \ldots \\ C_l \end{bmatrix} = \begin{bmatrix} 0 \\ REV\_D_1 \\ 0 \\ REV\_D_2 \\ \ldots \\ 0 \\ REV\_D_l \\ REV\_R_1 \\ REV\_R_2 \\ \ldots \\ REV\_R_l \end{bmatrix}$$ (18)

The elementary row transformation is performed on the above matrix equation to obtain the following forms:

$$\begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_l \\ 0 & 0 & \ldots & REV\_G\_ENC_l \\ REV\_G\_ENC_{1l} & REV\_G\_ENC_{2(l-1)} & \ldots & REV\_G\_ENC_{l1} \end{bmatrix} \begin{bmatrix} C_1 \\ C_2 \\ \ldots \\ C_l \end{bmatrix} = \begin{bmatrix} 0 \\ REV\_D_1 \\ REV\_R_1 \\ 0 \\ REV\_D_2 \\ REV\_R_2 \\ \ldots \\ 0 \\ REV\_D_l \\ REV\_R_l \end{bmatrix}$$ (19)

$$REV\_A = \begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_l \\ 0 & 0 & \ldots & REV\_G\_ENC_l \\ REV\_G\_ENC_{1l} & REV\_G\_ENC_{2(l-1)} & \ldots & REV\_G\_ENC_{l1} \end{bmatrix}.$$

$R(i)(1 \leq i \leq l)$ is set to the number of $i^{th}$ stage of symbols received and expanded. $L(i)$ is set to the length of each stage of symbols of a coding end. For $i=1:l$, a rank of each stage of generation matrix is calculated: eachRank(i)=min(Len(R(i)), sum(L(1:i))). Then, a rank of a cumulative matrix is calculated: cumRank(i)=min(cumRank(i−1)+eachRank(i), sum(L(1:i))), where cumRank(1)=eachRank(1). It is sequentially determined whether cumRank(i)>=sum(L(1:i)): if so, cumFullRank(i)=1; otherwise, cumFullRank(i)=0. The intermediate codes $C_1$, $C_2$ ... $C_l$ are solved in different situations according to the number of each stage of received symbols respectively, and an initial value of I is set to 1:

If satisfying cumFullRand(i)==1 && cumFullRank(1:i)>0, an RFC 6330 decoding method is used to solve C(1)-C(i).

$$REV\_A_{\Delta i} = \begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_i \\ 0 & 0 & \ldots & REV\_G\_ENC_i \\ REV\_G\_ENC_{1i} & REV\_G\_ENC_{2(i-1)} & \ldots & REV\_G\_ENC_{i1} \end{bmatrix},$$

and it is easy to know $$REV\_A_{\Delta i}^{-1} = \begin{bmatrix} A_1^{-1} & 0 & 0 & 0 \\ X_{1\_2} & A_2^{-1} & 0 & 0 \\ \ldots & \ldots & \ldots & 0 \\ X_{1\_i} & X_{2\_(i-1)} & \ldots & A_i^{-1} \end{bmatrix},$$

where $X_{1\_2} = A_2^{-1} B_{1\_2} A_1^{-1}$, $X_{a\_b} = A_b^{-1} B_{a\_b} A_a^{-1} + \Sigma_{k=a+1}^{b-1} B_{k\_b} X_{a\_k}$, and an intermediate code may be further obtained by the following formula:

$$C_{i\_temp} = REV\_A_i^{-1} \begin{bmatrix} 0 \\ REV\_D_i \\ REV\_R_i \end{bmatrix},$$

$$C_1 = C_{1\_temp}$$

$$C_2 = C_{2\_temp} + X_{1\_2} \begin{bmatrix} 0 \\ REV\_D_1 \\ REV\_R_1 \end{bmatrix} = C_{2\_temp} + A_2^{-1} B_{1\_2} C_1$$

$$C_3 = C_{3\_temp} + X_{1\_3} \begin{bmatrix} 0 \\ REV\_D_1 \\ REV\_R_1 \end{bmatrix} + X_{2\_3} \begin{bmatrix} 0 \\ REV\_D_2 \\ REV\_R_2 \end{bmatrix} =$$

$$C_{2\_temp} + A_3^{-1} B_{1\_3} C_1 + A_3^{-1} B_{2\_3} C_2$$

-continued

... (mathematical induction)

$$C_i = C_{i\_temp} + \sum_{j=1}^{i-1} X_{j\_i} \begin{bmatrix} 0 \\ REV\_D_j \\ REV\_R_j \end{bmatrix} = C_{i\_temp} + \sum_{j=1}^{i-1} A_i^{-1} B_{j\_i} C_j$$

$C_1, C_2 \ldots C_i$ are obtained, and other $C_{i+1} \ldots C_l$ cannot be solved.

If cumFullRand(i)==1 is satisfied and cumFullRank(1:i)>0 is not satisfied, a Gaussian elimination decoding method is used to solve C(1)-C(i).

$$REV\_A_{\Delta i} = \begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_i \\ 0 & 0 & \ldots & REV\_G\_ENC_i \\ REV\_G\_ENC_{1i} & REV\_G\_ENC_{2(i-1)} & \ldots & REV\_G\_ENC_{i1} \end{bmatrix}$$

and linear equations may be solved by a Gaussian elimination method:

$$\begin{bmatrix} G\_p_1 & 0 & \ldots & 0 \\ REV\_G\_ENC_1 & 0 & \ldots & 0 \\ REV\_G\_ENC_{11} & 0 & \ldots & 0 \\ 0 & G\_p_2 & \ldots & 0 \\ 0 & REV\_G\_ENC_2 & \ldots & \ldots \\ REV\_G\_ENC_{12} & REV\_G\_ENC_{21} & \ldots & 0 \\ \ldots & \ldots & \ldots & \ldots \\ 0 & 0 & \ldots & G\_p_i \\ 0 & 0 & \ldots & REV\_G\_ENC_i \\ REV\_G\_ENC_{1i} & REV\_G\_ENC_{2(i-1)} & \ldots & REV\_G\_ENC_{i1} \end{bmatrix} \begin{bmatrix} C_1 \\ C_2 \\ \ldots \\ C_l \end{bmatrix} = \begin{bmatrix} 0 \\ REV\_D_1 \\ REV\_R_1 \\ 0 \\ REV\_D_2 \\ REV\_R_2 \\ \ldots \\ 0 \\ REV\_D_i \\ REV\_i \end{bmatrix}$$ (20)

$C_1, C_2 \ldots C_i$ are obtained, and other $C_{i+1} \ldots C_l$ cannot be solved.

For any value of i, if cumFullRand(i)==1 is not satisfied, $C_i$ cannot be solved correspondingly. Until i==1, the above two conditions cannot be satisfied. $C_1, C_2 \ldots C_l$ cannot be all solved, and the decoding fails.

i=i−1 continues to cycle, that is, i=1:−1:1, and the above process is repeated.

Figure 10:
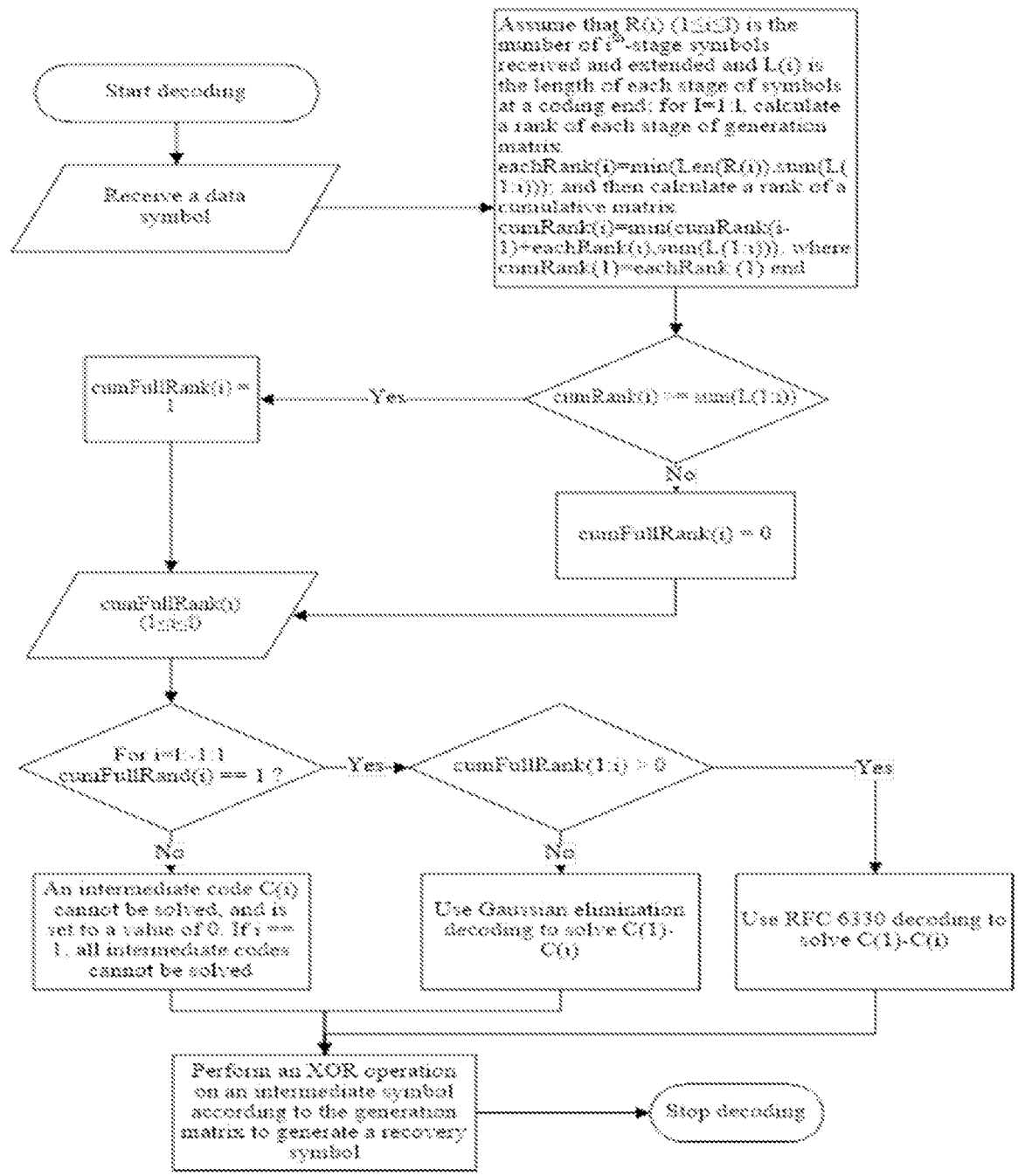
FIG. 10 is a flowchart of systematic fountain code decoding of multi-priority UEP.

The whole decoding process is shown in FIG. 10.

The method in this embodiment can effectively save resources. If the receiving end artificially discards the received data (such as a B frame) according to the situation, waste of transmission resources is caused. The above scheme solves the problem from a source side, allows unwanted packets to be dropped with a higher probability during transmission, and protects important packets to a greater degree.

The method in this embodiment provides a personalized transmission scheme. A UEP scheme may be designed according to channel conditions, user experience, etc., making video transmission more flexible and detailed. At the same time, although the flexible coding mode at the sending end is flexible, the receiving end may correctly recover original data according to list information.

The method in this embodiment provides a more flexible design of a coding matrix. Data may be prioritized based on media content according to an application scenario of the actual media, and an FEC coding matrix may be more flexibly designed according to actual needs to achieve the effect of UEP.

The method in this embodiment provides a more flexible decoding mode. Depending on the number of received priority data, different decoding algorithms may be used. With limited bandwidth resources, data with a higher priority may be recovered to the maximum extent, and the protection strength of the data with a higher priority may be improved.

Embodiment 2

Figure 11:
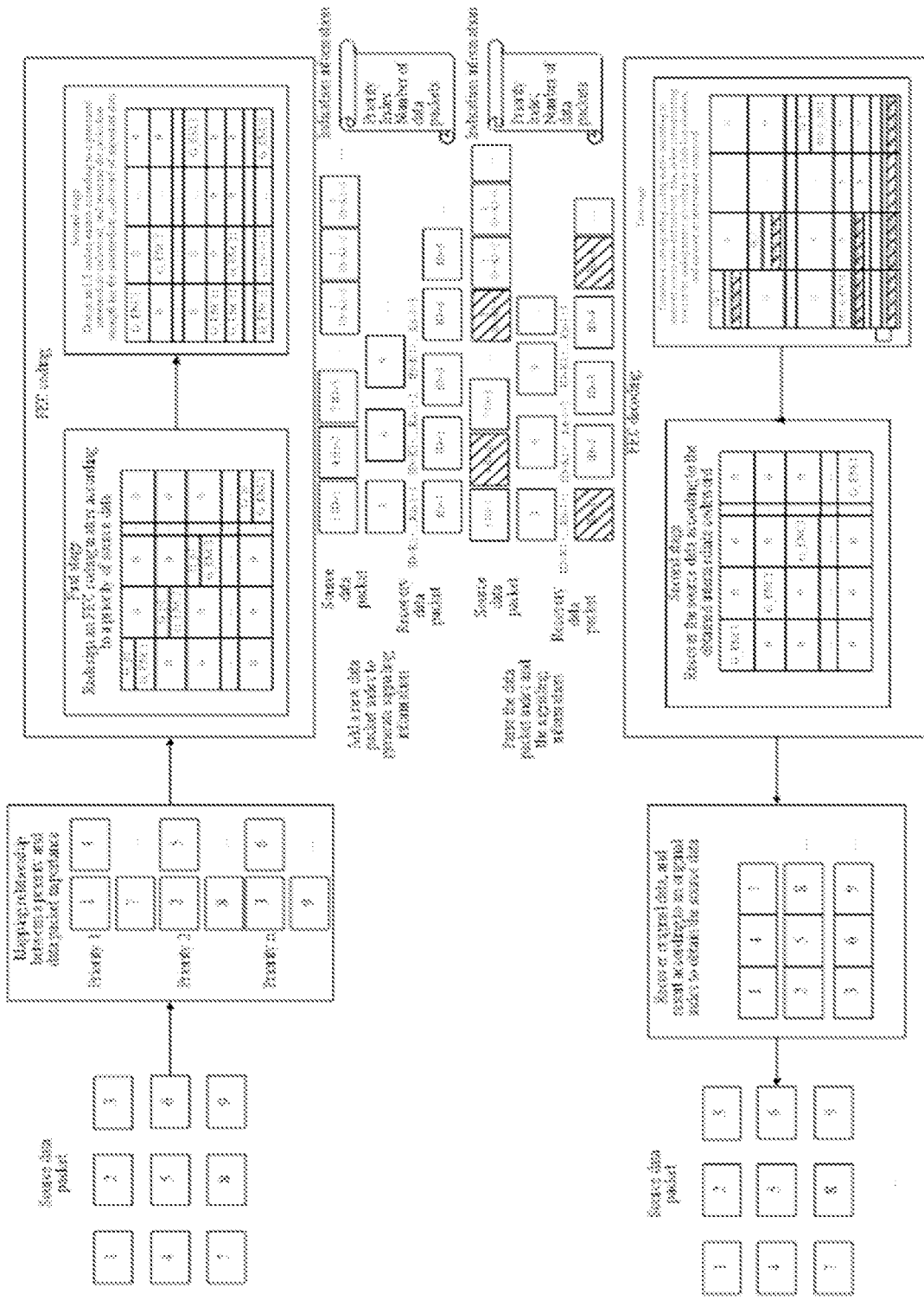
FIG. 11 is a schematic frame diagram of a media content-based adaptive systematic code FEC system.

Each sub-data packet in a source data packet may be mapped to different preset priorities respectively, or Embodiment 1 and Embodiment 2 may be combined in detail as follows:

FIG. 11 is a schematic frame diagram of a media content-based adaptive systematic code FEC system. The system includes a server and at least one terminal. Firstly, the server divides a plurality of priorities according to an actual application scenario and media content, parses, in a header of a data packet, importance information about the data packet, and maps each data packet to different priorities. Secondly, according to a priority situation and a mapping relationship, all data packets that need to be subjected to FEC are rearranged from a high priority to a low priority. Resorted source data is coded using an FEC coding mode with UEP according to actual channel conditions to generate recovery data (repair symbols). And after FEC coding is finished, index fields indicating a current data packet sequence are added to a source data packet and a recovery data packet. Source data and recovery data under each priority are counted to generate corresponding signaling information. The signaling indicates the number or proportion of data packets under each priority, and the number or proportion of corresponding recovery data under each priority, so that a receiving end may recover data correctly after receiving the data. Finally, the source data packet, the recovery data packet and the signaling are sent to a terminal (client or receiving end).

Correspondingly, the terminal firstly parses the signaling information and the index field in the received data packet to obtain the number of source data packets and recovery data packets received under each priority and corresponding data packet indexes. Secondly, according to the obtained data packet index information, a coding matrix is generated at the receiving end. Finally, according to the generated coding matrix, FEC decoding is performed in different situations, and the source data packet is recovered. Since the sequence of the recovered source data packets is a sequence after resorting, the source data packets are rearranged by parsing the sequence of the source data packets in the data packet header to obtain initial data of the source data packets.

The technical solution of the present invention will be described in detail below with specific embodiments. The following specific embodiments may be combined with each other, and the same or similar concepts or processes may not be repeated in some embodiments.

Embodiment 2.1

Figure 12:
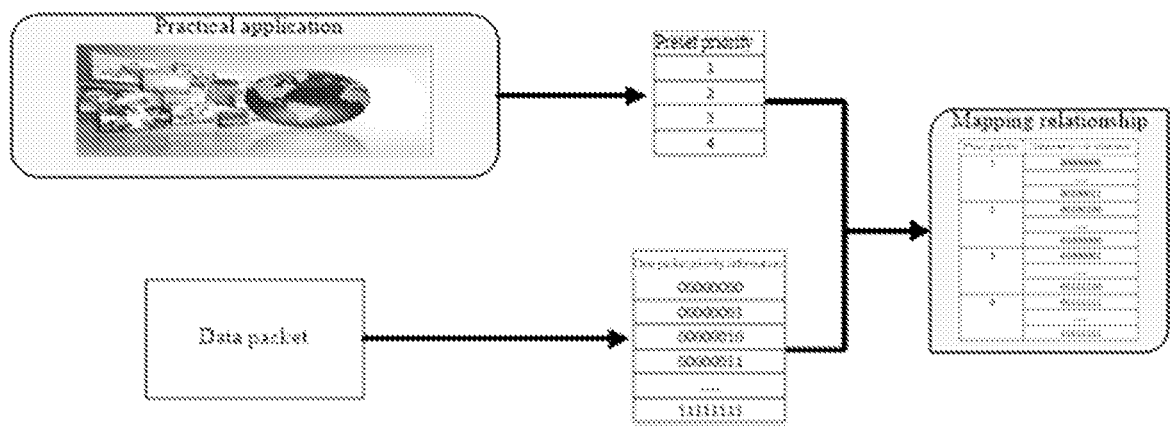
FIG. 12 is a schematic diagram of a mapping relationship between priorities.

As shown in FIG. 12, the following steps may be included.

S1: A header of a coded and encapsulated data packet is parsed, a priority field in the DU header is read, and an actual priority number and a mapping relationship with the priority field under each priority are determined according to actual applications.

Figure 13:
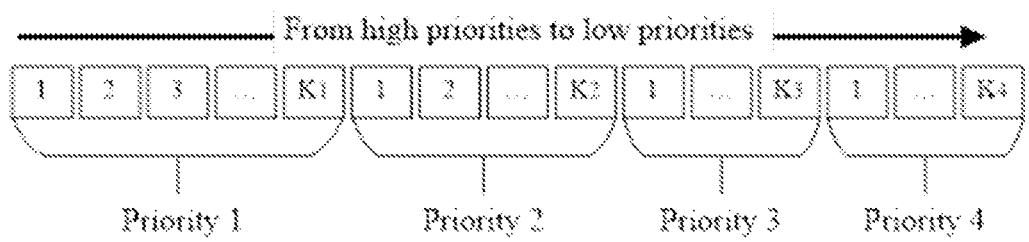
FIG. 13 is a schematic diagram of resorting data packet streams according to priority division.

S2: According to the divided priority and the mapping relationship, original source data streams are resorted from a high priority to a low priority, and the number of data packets under each priority is calculated, as shown in FIG. 13.

S3: FEC coding is performed on the resorted source data streams using an adaptive FEC coding scheme of a RaptorQ systematic code of a system to generate recovery data.

Specifically, FEC coding is performed on an intermediate data packet by using an adaptive FEC coding mode of a RaptorQ systematic code to obtain the following intermediate codeword:

$$\begin{bmatrix} C_1 \\ C_2 \\ \ldots \\ C_N \end{bmatrix} = \begin{bmatrix} A_1^{-1} & 0 & \ldots & 0 \\ 0 & A_2^{-1} & \ldots & 0 \\ \ldots & \ldots & \ldots & \ldots \\ \ldots & \ldots & \ldots & A_N^{-1} \end{bmatrix} \begin{bmatrix} 0 \\ D_1 \\ 0 \\ D_2 \\ \ldots \\ 0 \\ D_N \end{bmatrix}$$

where $A_i$ represents a coding matrix corresponding to an $i^{th}$ source data packet, $C_1, C_2, \ldots, C_i \ldots, C_N$ correspond to intermediate codes of N types of source data packets respectively, $D_1, D_2, \ldots, D_i \ldots, D_N$ correspond to data of the N types of source data packets respectively, and a superscript −1 is an inverse matrix operator.

A recovery data packet is obtained according to the intermediate codeword, and an FEC payload ID is added to the recovery data packet, recovery data in the recovery data packet being as follows:

$$\begin{bmatrix} D_1 \\ D_2 \\ \ldots \\ D_N \\ R_1 \\ R_2 \\ \ldots \\ R_N \end{bmatrix} = \begin{bmatrix} G_{ENC_1} & 0 & \ldots & 0 \\ 0 & G_{ENC_2} & \ldots & 0 \\ \ldots & \ldots & \ldots & \ldots \\ 0 & \ldots & \ldots & G_{ENC_N} \\ G_{ENC_{11}} & 0 & \ldots & 0 \\ G_{ENC_{12}} & G_{ENC_{21}} & \ldots & 0 \\ \ldots & \ldots & \ldots & \ldots \\ G_{ENC_{1N}} & G_{ENC_{2(N-1)}} & \ldots & G_{ENC_{N1}} \end{bmatrix} \begin{bmatrix} C_1 \\ C_2 \\ \ldots \\ C_N \end{bmatrix},$$

where $R_1, R_2, \ldots, R_i \ldots, R_N$ correspond to recovery data of 1-N source data packets respectively, $G\_ENC_i$ represents an LT coding matrix corresponding to an $i^{th}$ source data packet, $G\_ENC_{1i}$ represents an LT coding matrix with the same generation rule as $G\_ENC_1$, $G\_ENC_{i1}$ represents an LT coding matrix with the same generation rule as $G\_ENC_i$, and i=1, 2, ... N.

Figure 14:
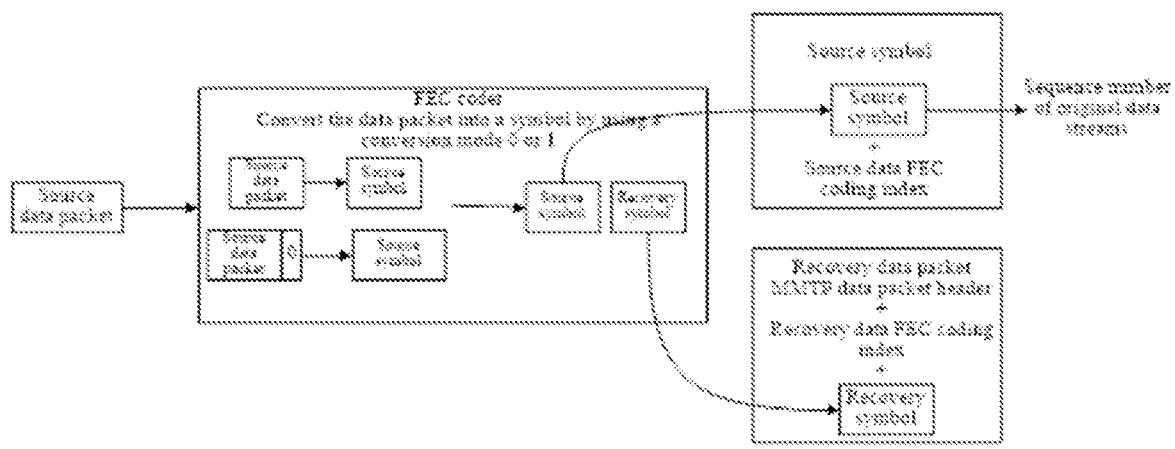
FIG. 14 is a schematic flowchart of processing a source data packet and a recovery data packet after FEC coding.

And according to a data stream (resorted data stream) output from an FEC coder, source data packets and recovery data packets are generated, and the FEC payload ID is added, as shown in FIG. 14.

S4: An AL-FEC message is generated, and the number of data packets under each priority and the number of corresponding recovery data packets under each priority are indicated in the signaling, so that the receiving end may recover data correctly after receiving the data. The specific signaling is shown in Table 1.

TABLE 1

Signaling Information Comparison

| Grammar | Value | Bits | Notes |
|---|---|---|---|
| if (fec__coding__structure == 0100) { | | | |
|   number_of___priority | N8 | | uimbsf |
|   for(i=0;i<N8;i++) { | | | |
|     fec__ priority__ value | | 8 | uimbsf |
|     number_of__source__symbol | | 16 | uimbsf |
|     number_of__repair__symbol | | 16 | uimbsf |
|   } | | | |
|   if (private__fec__flag == 1) { | | | |
|     private__flag | N7 | 1 | bslbf |
|     private__field__length | | 7 | bslbf |
|     private__field | | N7*8 | uimbsf |
|   } | | | |
|   repair__flow__id | | 8 | uimbsf |
|   fec__code__id__for__repair__flow | | 8 | uimbsf |
|   maximum__k__for__repair__flow | | 24 | uimbsf |
|   maximum__p__for__repair__flow | | 24 | uimbsf |
|   protection__window__time | | 32 | uimbsf |
|   protection__window__size | | 32 | uimbsf |
| } | | | |

In Table 1, number_of_priority indicates the number of priorities. fec_priority_value is 8-bit, which indicates a value corresponding to each priority, which may be at most the same as a priority defined as priority in a DU header, or may correspond to priority in a plurality of DU headers. number_of_source_symbol is 16-bit, which indicates the number of source symbols when the priority is the value indicated by fec_priority_value. number_of_repair_symbol is 16-bit, which indicates the number of repair symbols when the priority is the value indicated by fec_priority_value. private_fec_flag is an indication bit, which indicates whether a private FEC coding scheme is used. private_flag is an indication bit, which indicates whether a private_field exists to describe the used private FEC coding scheme. private_field_length is a length field, which is used to describe the length of a field of the private FEC coding scheme. private_field is used to describe detailed information of the private FEC scheme. priority_id is a priority id, which is used to indicate the priority of MMT packets. fec_code_id_for_repair_flow is used to describe the used FEC coding scheme. repair_flow_id is an 8-bit integer, used to indicate a generated FEC repair flow, which corresponds to a packet id in a header of an FEC repair packet. maximum_k_for_repair_flow is a 24-bit integer, which describes the maximum number of source symbols in a source symbol block. maximum_p_for_repair_flow is a 24-bit integer, which describes the maximum number of repair symbols in a repair symbol block. protection_window_time is a protection window time, which indicates a maximum time difference between sending the first source or repair packet and sending the last source or repair packet in FEC coding, in milliseconds. protection_window_size is a protection window value, which indicates a maximum count value between a load of sending the first FEC packet and a load of sending the last FEC packet in an FEC coding stream.

Figure 15:
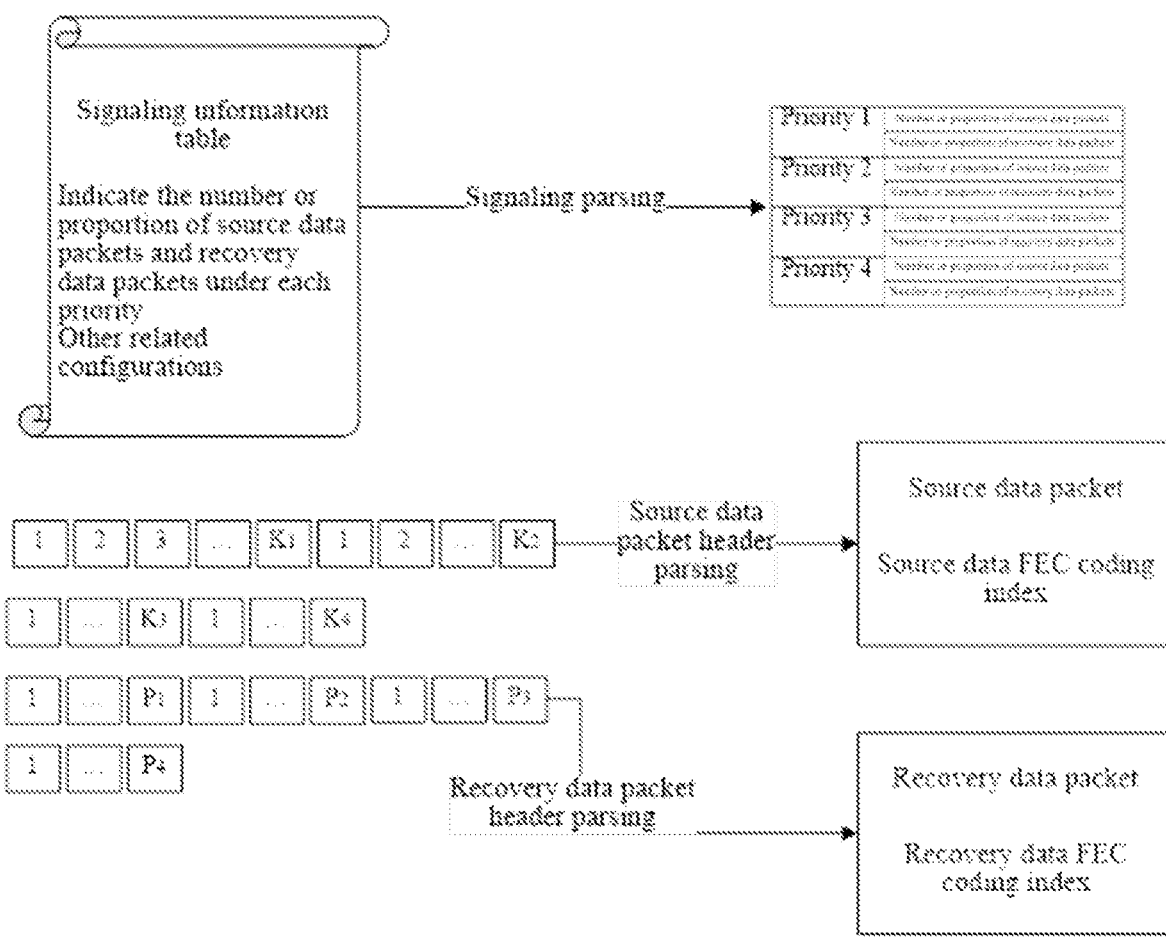
FIG. 15 is a schematic diagram of parsing signaling information and data packet information at a receiving end.

As shown in FIG. 15, an index of a corresponding row of a coding matrix corresponding to source data is obtained according to the number of data packets of FEC under each priority by the following formula:

index=FECpayloadID−numberofpacketsofallpriori-
tiesbeforethispacket, where index represents a corresponding row index of a coding matrix corresponding to source data, FEC payload ID represents index information of a data packet header, and number of packets of all priorities before this packet represents the total number of data packets of all priorities before this data packet.

Figure 16:
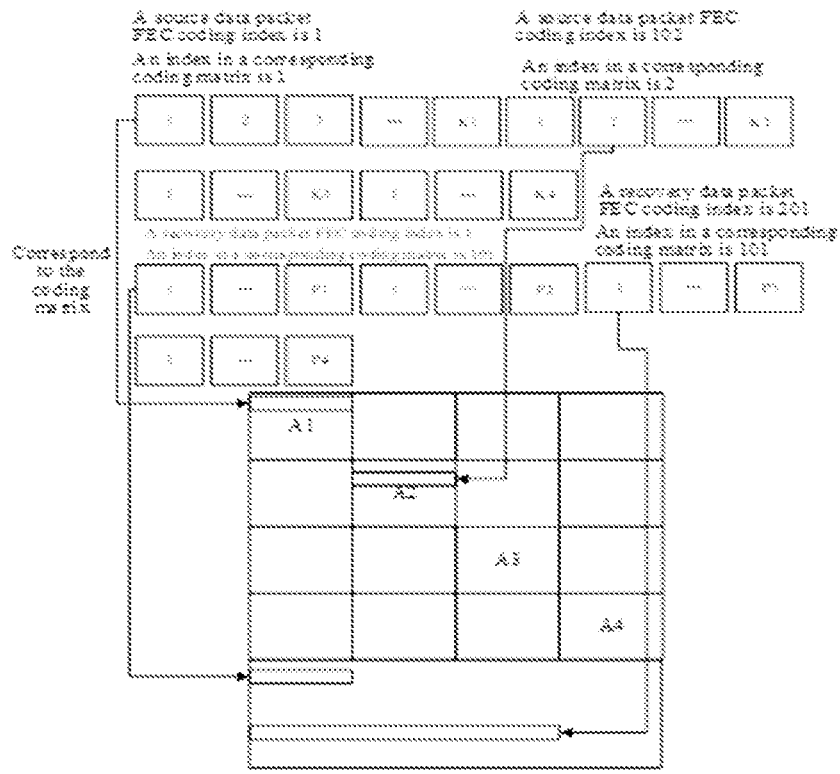
FIG. 16 is a schematic diagram of generating a coding matrix according to a received data packet.

For example, there are four priorities, and the number of each priority is 100, as shown in FIG. 16. source_FEC_payload_ID is sorted according to the sequence of the resorted source data packets. If the priority is 1, an ISI (index) that generates a coding matrix may be directly determined according to the current source_FEC_payload_ID. When the priority is greater than 1, during header parsing, according to the value of source_FEC_payload_ID and the number of source symbols under each priority, it may be determined which priority it belongs to. For example, source_FEC_payload_ID=108, it may be determined that it belongs to a priority of 2, and ISI=8 based on the above formula. For the recovery data packet, an ISI of a generation matrix may be determined according to repair_FEC_payload_ID in the packet header. Since the sending end and the receiving end use the same FEC coding mechanism, a corresponding coding matrix may be generated according to the above two indexes.

Figure 17:
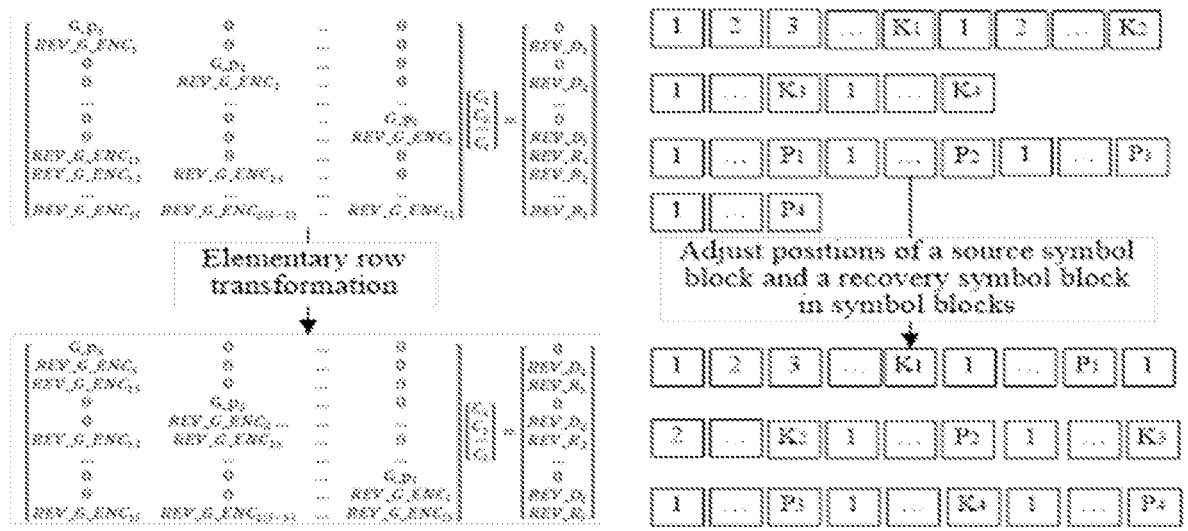
FIG. 17 is a schematic flowchart of processing a received data packet.
Figure 18:
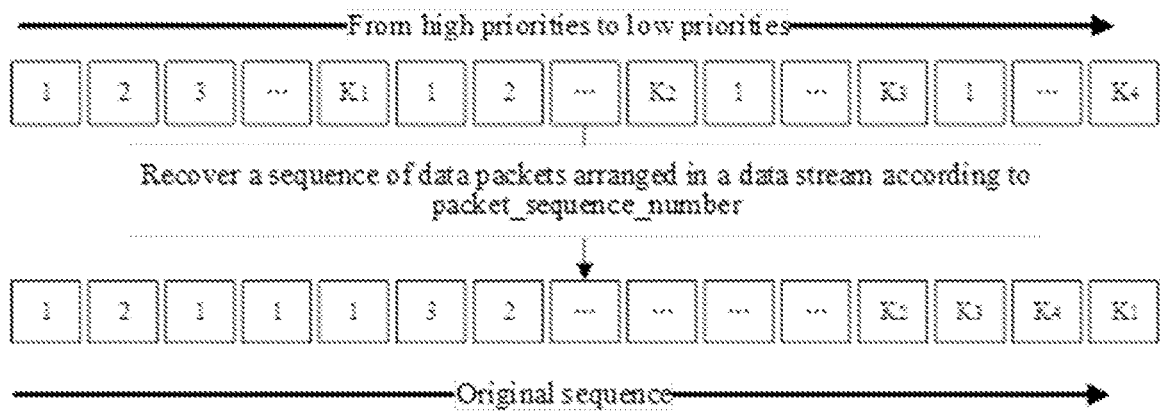
FIG. 18 is a schematic diagram of a result of recovering an initial sequence of data packet streams.

According to the generated FEC coding matrix, elementary row transformation is performed on the coding matrix, and the corresponding received data packets are sorted. According to the value of repair_FEC_payload_ID and the number of recovery symbols under each priority, it is determined which priority it belongs to, thereby adjusting the position of a recovery symbol in a symbol block to achieve the same change, as shown in FIG. 17. According to the number of received data packets of different priorities, decoding is performed in different situations. The flowchart is shown in FIG. 10. Finally, the recovered source data is obtained, and the obtained source data packets are recovered to an initial sequence according to packet_sequence_number in the packet header, specifically as shown in FIG. 18.

Embodiment 2.2: As shown in FIG. 12, the following steps may be included.

S1: A header of a coded and encapsulated data packet is parsed, a priority field in the DU header is read, and an actual priority number and a mapping relationship with the priority field under each priority are determined according to actual applications.

S2: According to the divided priority and the mapping relationship, original source data streams are resorted from a high priority to a low priority, and the number of data packets under each priority is calculated, as shown in FIG. 13.

S3: FEC coding is performed on the resorted source data streams using an adaptive FEC coding scheme of a RaptorQ systematic code of a system to generate recovery data.

Specifically, FEC coding is performed on an intermediate data packet by using an adaptive FEC coding mode of a RaptorQ systematic code to obtain the following intermediate codeword:

$$\begin{bmatrix} C_1 \\ C_2 \\ \dots \\ C_N \end{bmatrix} = \begin{bmatrix} A_1^{-1} & 0 & \dots & 0 \\ 0 & A_2^{-1} & \dots & 0 \\ \dots & \dots & \dots & \dots \\ \dots & \dots & \dots & A_N^{-1} \end{bmatrix} \begin{bmatrix} 0 \\ D_1 \\ 0 \\ D_2 \\ \dots \\ 0 \\ D_N \end{bmatrix},$$

where $A_i$ represents a coding matrix corresponding to an $i^{th}$ source data packet, $C_1, C_2, \dots, C_i \dots, C_N$ correspond to intermediate codes of N types of source data packets respectively, $D_1, D_2, \dots, D_i \dots, D_N$ correspond to data of the N types of source data packets respectively, and a superscript −1 is an inverse matrix operator.

A recovery data packet is obtained according to the intermediate codeword, and an FEC payload ID is added to the recovery data packet, recovery data in the recovery data packet being as follows:

$$\begin{bmatrix} D_1 \\ D_2 \\ \dots \\ D_N \\ R_1 \\ R_2 \\ \dots \\ R_N \end{bmatrix} = \begin{bmatrix} G_{ENC_1} & 0 & \dots & 0 \\ 0 & G_{ENC_2} & \dots & 0 \\ \dots & \dots & \dots & \dots \\ 0 & \dots & \dots & G_{ENC_N} \\ G_{ENC_{11}} & 0 & \dots & 0 \\ G_{ENC_{12}} & G_{ENC_{21}} & \dots & 0 \\ \dots & \dots & \dots & \dots \\ G_{ENC_{1N}} & G_{ENC_{2(N-1)}} & \dots & G_{ENC_{N1}} \end{bmatrix} \begin{bmatrix} C_1 \\ C_2 \\ \dots \\ C_N \end{bmatrix},$$

where $R_1, R_2, \dots, R_i \dots, R_N$ correspond to recovery data of 1-N source data packets respectively, $G\_ENC_i$ represents an LT coding matrix corresponding to an $i^{th}$ source data packet, $G\_ENC_{1i}$ represents an LT coding matrix with the same generation rule as $G\_ENC_1$, $G\_ENC_{i1}$ represents an LT coding matrix with the same generation rule as $G\_ENC_i$, and i=1, 2, . . . N.

S4: Corresponding indication information is generated in the data packet header extension, and the number of data packets under each priority and the number of corresponding recovery data packets under each priority are indicated, so that the receiving end may recover data correctly after receiving the data, specifically as shown in FIG. 20.

Figure 20:
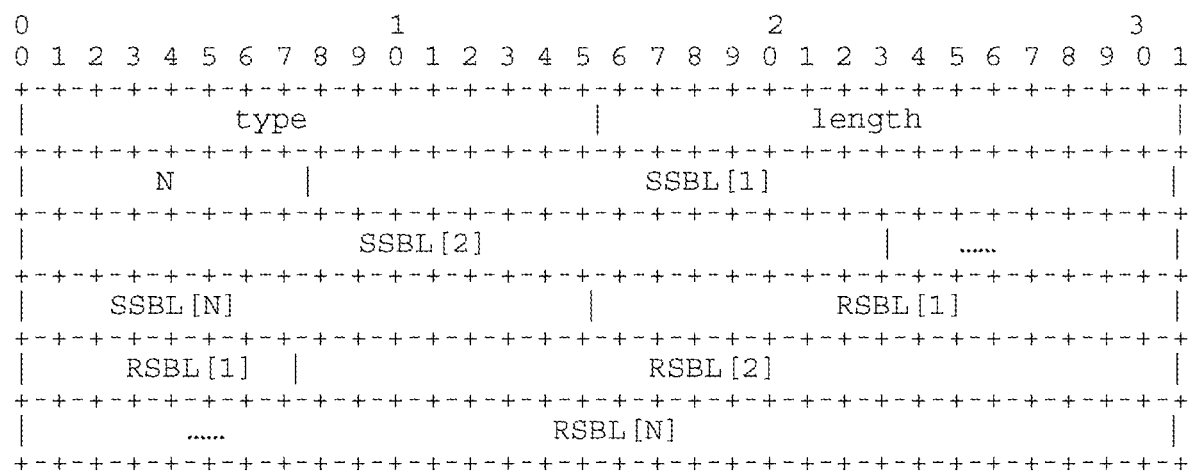
FIG. 20 is a table of configuration information that instructs the receiving end recover data correctly after receiving the data.

In FIG. 20, type is 16-bit, which indicates the type of the current packet header extension and indicates an intermediate data packet or a recovery data packet for adaptive FEC coding herein. Length is 16-bit, used to indicate the length of header_extension. FEC_priority is 8-bit, used to indicate the priority to which the current data packet belongs. sub_encoded_symbol_id is 16-bit, used to indicate an index of the number of intermediate data packets or recovery data packets under this priority. N is 8-bit, used to indicate the total number of priorities. SSBL [i] is 24-bit, wherein i represents the $i^{th}$ priority, used to indicate the number of source data packets of each priority. RSBL [i] is 24-bit, wherein i represents the $i^{th}$ priority, used to indicate the number of recovery data packets of each priority.

Figure 19:
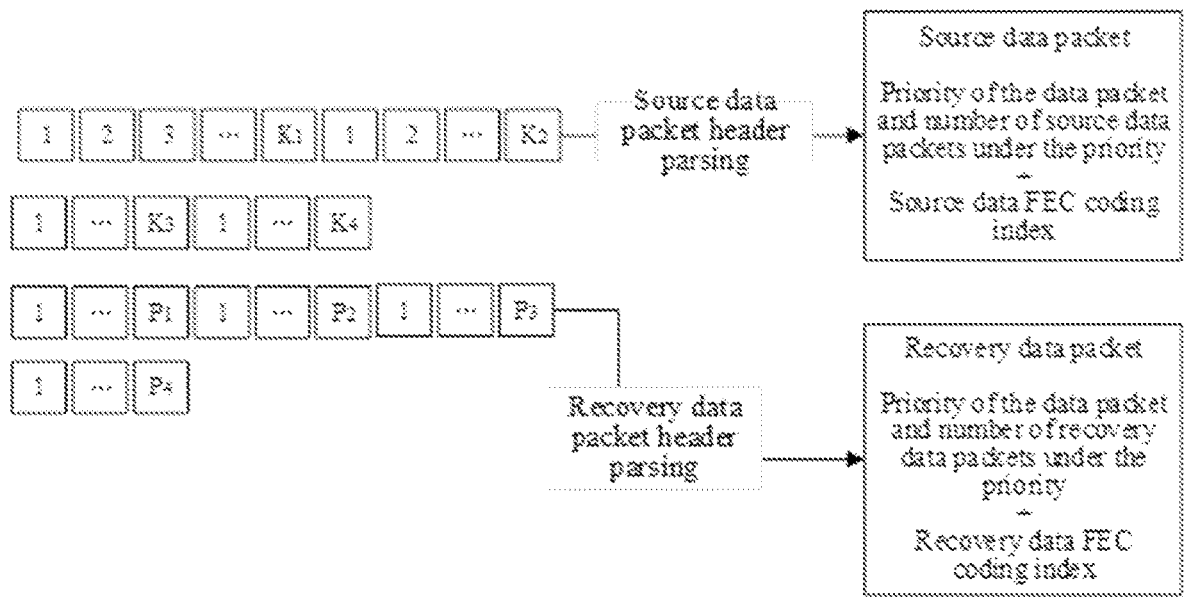
FIG. 19 is a schematic diagram of parsing data packet header information at a receiving end.

As shown in FIG. 19, an index of a corresponding row of a coding matrix corresponding to source data is obtained according to the number of data packets of FEC under each priority by the following formula:

index=FECpayloadID−numberofpacketsofallpriori-
tiesbeforethispacket, where index represents a corresponding row index of a coding matrix corresponding to source data, FEC payload ID represents index information of a data packet header, and number of packets of all priorities before this packet represents the total number of data packets of all priorities before this data packet.

According to the generated FEC coding matrix, elementary row transformation is performed on the coding matrix, and the corresponding received data packets are sorted. According to the value of repair_FEC_payload_ID and the number of recovery symbols under each priority, it is determined which priority it belongs to, thereby adjusting the position of a recovery symbol in a symbol block to achieve the same change, as shown in FIG. 17. According to the number of received data packets of different priorities, decoding is performed in different situations. The flowchart is shown in FIG. 10. Finally, the recovered source data is obtained, and the obtained source data packets are recovered to an initial sequence according to packet_sequence_number in the packet header, specifically as shown in FIG. 18.

In this embodiment, a server side gives different protections to data of different importance levels by dividing the importance of different data in a data stream. Identification is performed by header information and signaling information of a sent data packet. A systematic code mode is used to adaptively adjust a coding matrix of a system fountain code according to channel conditions and the importance of data, so as to achieve UEP for data of different importance levels. A terminal side parses the signaling information and header information, also uses a flexible decoding algorithm according to the amount of different priority data received to achieve flexible coding and decoding, and finally recovers a source data. stream according to the header information. Therefore, the following beneficial effects can be achieved:

1) Resources are saved. If the terminal side (receiving end) artificially discards the received data (such as a B frame) according to the situation, waste of transmission resources is caused. The method in this embodiment solves the problem from a source side, allows unwanted packets to be dropped with a higher probability during transmission, and protects important packets to a greater degree.

2) A personalized transmission scheme is implemented. For example, a UEP scheme may be designed according to channel conditions, user experience, etc., making video transmission more flexible and detailed. In addition, although the flexible coding mode at the sending end is flexible, the receiving end may correctly recover original data according to list information.

3) A more flexible design of a coding matrix is implemented. For example, data may be prioritized based on media content according to an application scenario of the actual media, and an FEC coding matrix may be more flexibly designed according to actual needs to achieve the effect of UEP.

4) A more flexible decoding mode is implemented. For example, depending on the number of received priority data, different decoding algorithms may be used. With limited bandwidth resources, data with a higher priority may be recovered to the maximum extent, and the protection strength of the data with a higher priority may be improved.

It should be noted that the steps in the media content-based adaptive method for FEC coding and decoding of a systematic code provided by the present invention may be implemented by using corresponding modules, devices, units, etc. in the media content-based adaptive systematic code FEC system. A person skilled in the art may refer to the technical solution of the system to implement the step flow of the method, that is, the embodiments in the system may be understood as the preferred examples of implementing the method, and descriptions are omitted herein.

In addition, the present invention may be applied to a computer-readable storage medium. The computer-readable storage medium stores a computer program. When the computer program is executed by a processor, the steps of the media content-based adaptive method for FEC coding and decoding of a systematic code described in the foregoing embodiment are implemented.

Those skilled in the art know that, the system and various devices, modules, and units thereof provided in the present invention may be implemented purely by computer-readable program code, and the steps in the method may also be logically programmed to enable the system and various devices, modules, and units thereof provided in the present invention to implement the same functions in the form of logic gates, switches, application-specific integrated circuits, programmable logic controllers, and embedded microcontrollers. Therefore, the system and various devices, modules, and units thereof provided in the present invention may be considered as a hardware component, and the devices, modules, and units included in the system for implementing various functions may also be regarded as structures in the hardware component; the devices, modules, and units for implementing various functions may also be regarded as both software modules for implementing the method and structures in the hardware component.

Specific embodiments of the present invention are described above. It should be understood that the present invention is not limited to the specific embodiments described above, and those skilled in the art may make various changes or modifications within the scope of the claims without departing from the essential spirit of the present invention. The embodiments of this application and characteristics of the embodiments may be randomly combined with each other provided that there is no conflict.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for transmitting a Forward Error Correction (FEC) coding codeword, comprising:
   dividing source data into N types of source data packets according to priorities, N being an integer greater than 1;
   rearranging sub-data packets in the N types of source data packets according to said priorities to generate N types of intermediate data packets;
   performing FEC coding on the N types of intermediate data packets to generate N types of intermediate codewords;
   generating N types of recovery data packets according to the N types of intermediate codewords;

adding an index field and a priority indication field to the intermediate data packets and the recovery data packets; and transmitting the intermediate data packets, the recovery data packets and corresponding indication information.

2. The method for transmitting the FEC coding codeword according to claim 1, wherein before dividing the source data into the N types of source data packets according to said priorities, the method comprises the following steps:

parsing header information of each sub-data packet in the source data packets to determine a priority corresponding to the sub-data packet.

3. The method for transmitting the FEC coding codeword according to claim 1, wherein performing FEC coding on the N types of intermediate data packets to generate the N types of intermediate codewords comprises:

constructing a coding matrix corresponding to each type of intermediate data packet;

constructing coding matrices corresponding to the N types of intermediate data packets according to the coding matrix corresponding to each type of intermediate data packet; and generating the N types of intermediate codewords according to the N types of intermediate data packets and the corresponding coding matrices thereof.

4. The method for transmitting the FEC coding codeword according to claim 1, wherein a coding matrix corresponding to each type of intermediate data packet comprises two sub-matrices, one of the sub-matrices is a joint matrix composed of a low-density parity-check (LDPC) matrix and an identity matrix corresponding to the intermediate data packet, and the other sub-matrix is a Luby Transform (LT) coding matrix corresponding to the intermediate data packet.

5. The method for transmitting the FEC coding codeword according to claim 1, wherein generating the N types of recovery data packets according to the N types of intermediate codewords comprises:

constructing, according to Luby Transform (LT) coding matrices corresponding to the N types of intermediate data packets, expansion matrices of the LT coding matrices corresponding to the N types of intermediate data packets; and generating the N types of recovery data packets according to the expansion matrices of the LT coding matrices corresponding to the N types of intermediate data packets and the N types of intermediate codewords.

6. The method for transmitting the FEC coding codeword according to claim 5, wherein the construction of the expansion matrices of the LT coding matrices corresponding to the N types of intermediate data packets is related to added redundant information.

7. The method for transmitting the FEC coding codeword according to claim 1, wherein the index field added in the recovery data packet is configured to indicate a sequence of sub-data packets in the recovery data packet, and/or indicate a sequence of sub-data packets in the recovery data packet under a priority corresponding to the priority indication field added in the recovery data packet, and/or indicate the number of sub-data packets belonging to the corresponding priority or a proportion of the sub-data packets in the recovery data packet.

8. The method for transmitting the FEC coding codeword according to claim 1, wherein the index field added in the intermediate data packet is configured to indicate a sequence of sub-data packets in the intermediate data packet, and/or indicate a sequence of sub-data packets in the intermediate data packet under a priority corresponding to the priority indication field added in the intermediate data packet.

9. The method for transmitting the FEC coding codeword according to claim 1, wherein the indication information is configured to indicate sub-data packets of the recovery data packet under each priority, and/or the indication information is configured to indicate sub-data packets of the intermediate data packet under each priority.

10. A method for decoding a Forward Error Correction (FEC) coding codeword, comprising:

receiving a sent recovery data packet and intermediate data packet and corresponding indication information;

parsing an index field and a priority indication field contained in the recovery data packet and the intermediate data packet, and the indication information, and generating a recovery matrix according to a loss situation of the recovery data packet and the intermediate data packet, the index field of the recovery data packet and the intermediate data packet, and the indication information;

generating an intermediate codeword according to the recovery matrix and the received recovery data packet and intermediate data packet;

performing FEC decoding on the intermediate codeword to recover a decoded intermediate data packet; and parsing total header information of sub-data packets in the decoded intermediate data packet, rearranging the sub-data packets in the decoded intermediate data packet, and recovering a source data packet.

11. The method for decoding the FEC coding codeword according to claim 10, wherein the index field contained in the recovery data packet is configured to indicate a sequence of sub-data packets in the recovery data packet, and/or indicate a sequence of sub-data packets in the recovery data packet under a priority corresponding to the priority indication field contained in the recovery data packet, and/or indicate a number of sub-data packets belonging to the corresponding priority or a proportion of the sub-data packets in the recovery data packet.

12. The method for decoding the FEC coding codeword according to claim 10, wherein the index field contained in the intermediate data packet is configured to indicate a sequence of sub-data packets in the intermediate data packet, and/or indicate a sequence of sub-data packets in the intermediate data packet under a priority corresponding to the priority indication field contained in the intermediate data packet.

13. The method for decoding the FEC coding codeword according to claim 10, wherein the indication information is configured to indicate sub-data packets of the recovery data packet under each priority, and/or the indication information is configured to indicate sub-data packets of the intermediate data packet under each priority.

14. The method for decoding the FEC coding codeword according to claim 10, wherein generating the recovery matrix according to the loss situation of the recovery data packet and the intermediate data packet, the index field contained in the recovery data packet, the index field contained in the intermediate data packet, and the indication information comprises:
generating a coding matrix of the intermediate data packet according to the index field and the priority indication field contained in the recovery data packet and the intermediate data packet, and the indication information; and
generating the recovery matrix according to the coding matrix of the intermediate data packet and the loss situation of the recovery data packet and the intermediate data packet.

15. The method for decoding the FEC coding codeword according to claim 14, wherein
performing FEC decoding on the intermediate codeword to recover the decoded intermediate data packet comprises:
generating the decoded intermediate data packet according to a Luby Transform (LT) coding matrix of the intermediate data packet and the intermediate codeword.

16. A device for transmitting a Forward Error Correction (FEC) coding codeword, comprising:
a mapping module, configured to divide source data into N types of source data packets according to priorities, N being an integer greater than 1;
a sorting module, configured to rearrange sub-data packets in the N types of source data packets according to said priorities to generate N types of intermediate data packets;
a coding module, configured to perform FEC coding on the N types of intermediate data packets to generate N types of intermediate codewords, and generate N types of recovery data packets according to the N types of intermediate codewords;
an index module, configured to add an index field and a priority indication field to the intermediate data packets and the recovery data packets; and
a sending module, configured to transmit the intermediate data packets, the recovery data packets and corresponding indication information.

17. The device for transmitting the FEC coding codeword according to claim 16, further comprising:
a parsing module, configured to parse header information of each sub-data packet in the source data packets to determine a priority corresponding to the sub-data packet.

18. The device for transmitting the FEC coding codeword according to claim 16, wherein
performing, by the coding module, FEC coding on the N types of intermediate data packets to generate the N types of intermediate codewords comprises:
constructing a coding matrix corresponding to each type of intermediate data packet;
constructing coding matrices corresponding to the N types of intermediate data packets according to the coding matrix corresponding to each type of intermediate data packet; and
generating the N types of intermediate codewords according to the N types of intermediate data packets and the corresponding coding matrices thereof.

19. The device for transmitting the FEC coding codeword according to claim 16, wherein
a coding matrix corresponding to each type of intermediate data packet comprises two sub-matrices, one of the sub-matrices is a joint matrix composed of a low-density parity-check (LDPC) matrix and an identity matrix corresponding to the intermediate data packet, and the other sub-matrix is a Luby Transform (LT) coding matrix corresponding to the intermediate data packet.

20. The device for transmitting the FEC coding codeword according to claim 16, wherein
generating, by the coding module, the N types of recovery data packets according to the N types of intermediate codewords comprises:
constructing, according to Luby Transform (LT) coding matrices corresponding to the N types of intermediate data packets, expansion matrices of the LT coding matrices corresponding to the N types of intermediate data packets; and
generating the N types of recovery data packets according to the expansion matrices of the LT coding matrices corresponding to the N types of intermediate data packets and the N types of intermediate codewords.

21. The device for transmitting the FEC coding codeword according to claim 20, wherein
the construction of the expansion matrices of the LT coding matrices corresponding to the N types of intermediate data packets is related to added redundant information.

22. The device for transmitting the FEC coding codeword according to claim 16, wherein
the index field added in the recovery data packet by the index module is configured to indicate a sequence of sub-data packets in the recovery data packet, and/or indicate a sequence of sub-data packets in the recovery data packet under a priority corresponding to the priority indication field added in the recovery data packet, and/or indicate a number of sub-data packets belonging to the corresponding priority or a proportion of the sub-data packets in the recovery data packet.

23. The device for transmitting the FEC coding codeword according to claim 16, wherein
the index field added in the intermediate data packet by the index module is configured to indicate a sequence of sub-data packets in the intermediate data packet, and/or indicate a sequence of sub-data packets in the intermediate data packet under a priority corresponding to the priority indication field added in the intermediate data packet.

24. The device for transmitting the FEC coding codeword according to claim 16, wherein
the indication information is configured to indicate sub-data packets of the recovery data packet under each priority, and/or the indication information is configured to indicate sub-data packets of the intermediate data packet under each priority.

25. A device for decoding a Forward Error Correction (FEC) coding codeword, comprising:
a receiving module, configured to receive a sent recovery data packet and intermediate data packet and corresponding indication information;
a recovery matrix generating module, configured to parse an index field and a priority indication field contained in the recovery data packet and the intermediate data packet, and the indication information, and generate a recovery matrix according to a loss situation of the recovery data packet and the intermediate data packet, the index field of the recovery data packet, the index field of the intermediate data packet, and the indication information;

a decoding module, configured to generate an intermediate codeword according to the recovery matrix and the received recovery data packet and intermediate data packet, and perform FEC decoding on the intermediate codeword to recover a decoded intermediate data packet; and a recovery module, configured to parse total header information of sub-data packets in the decoded intermediate data packet, rearrange the sub-data packets in the decoded intermediate data packet, and recover a source data packet.

26. The device for decoding the FEC coding codeword according to claim 25, wherein the index field contained in the recovery data packet is configured to indicate a sequence of sub-data packets in the recovery data packet, and/or indicate a sequence of sub-data packets in the recovery data packet under a priority corresponding to the priority indication field contained in the recovery data packet, and/or indicate a number of sub-data packets belonging to the corresponding priority or a proportion of the sub-data packets in the recovery data packet.

27. The device for decoding the FEC coding codeword according to claim 25, wherein the index field contained in the intermediate data packet is configured to indicate a sequence of sub-data packets in the intermediate data packet, and/or indicate a sequence of sub-data packets in the intermediate data packet under a priority corresponding to the priority indication field contained in the intermediate data packet.

28. The device for decoding the FEC coding codeword according to claim 25, wherein the indication information is configured to indicate sub-data packets of the recovery data packet under each priority, and/or the indication information is configured to indicate sub-data packets of the intermediate data packet under each priority.

29. The device for decoding the FEC coding codeword according to claim 25, wherein generating, by the recovery matrix generating module, the recovery matrix according to the loss situation of the recovery data packet and the intermediate data packet, the index field of the recovery data packet and the index field of the intermediate data packet, and the indication information comprises:

generating a coding matrix of the intermediate data packet according to the index field and the priority indication field contained in the recovery data packet and the intermediate data packet, and the indication information; and generating the recovery matrix according to the coding matrix of the intermediate data packet and the loss situation of the recovery data packet and the intermediate data packet.

30. The device for decoding the FEC coding codeword according to claim 29, wherein the decoding module generates the decoded intermediate data packet according to a Luby Transform (LT) coding matrix of the intermediate data packet and the intermediate codeword.

31. A non-transitory computer-readable storage medium storing a computer program, the computer program being executed by a processor to implement a first method for transmitting a Forward Error Correction (FEC) coding codeword comprising:

dividing source data into N types of source data packets according to priorities, N being an integer greater than 1;

rearranging sub-data packets in the N types of source data packets according to said priorities to generate N types of intermediate data packets;

performing FEC coding on the N types of intermediate data packets to generate N types of intermediate codewords;

generating N types of recovery data packets according to the N types of intermediate codewords;

adding index fields and priority indication fields to the intermediate data packets and the recovery data packets; and transmitting the intermediate data packets, the recovery data packets and corresponding indication information; and/or a second method for decoding an FEC coding codeword of comprising:

receiving a sent recovery data packet and intermediate data packet and corresponding indication information;

parsing an index field and a priority indication field contained in the recovery data packet and the intermediate data packet, and the indication information, and generating a recovery matrix according to a loss situation of the recovery data packet and the intermediate data packet, the index field of the recovery data packet and the intermediate data packet, and the indication information;

generating an intermediate codeword according to the recovery matrix and the received recovery data packet and intermediate data packet;

performing FEC decoding on the intermediate codeword to recover a decoded intermediate data packet; and parsing total header information of sub-data packets in the decoded intermediate data packet, rearranging the sub-data packets in the decoded intermediate data packet, and recovering a source data packet.

* * * * *